(12) United States Patent
Li et al.

(10) Patent No.: US 9,536,906 B2
(45) Date of Patent: Jan. 3, 2017

(54) PIXEL STRUCTURE, LIQUID CRYSTAL DISPLAY ARRAY SUBSTRATE AND LIQUID CRYSTAL DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventors: Xiaoye Li, Shanghai (CN); Zhaokeng Cao, Shanghai (CN); Zhongshou Huang, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/616,553

(22) Filed: Feb. 6, 2015

(65) Prior Publication Data

US 2015/0380435 A1 Dec. 31, 2015

(30) Foreign Application Priority Data

Jun. 30, 2014 (CN) .......................... 2014 1 0308998

(51) Int. Cl.
*H01L 27/12* (2006.01)
*G02F 1/1368* (2006.01)
(Continued)

(52) U.S. Cl.
CPC ........... *H01L 27/124* (2013.01); *G02F 1/1368* (2013.01); *G02F 1/134309* (2013.01);
(Continued)

(58) Field of Classification Search
CPC .............. G09G 2300/0426; G09G 2300/028; G09G 2300/0439; G09G 2300/0478; G09G 3/3648; G09G 3/3696; G09G 3/3225; G09G 3/3275; G09G 3/3291; G09G 3/3659; G09G 3/3685; G09G 2310/0202; G09G 2310/0262; G09G 2310/0289; G09G 2310/0294; G09G 2310/06; G09G 2320/04; H01L 27/3276; H01L 27/3248; H01L 27/3262; H01L 27/14603; H01L 27/3244;
(Continued)

(56) References Cited

U.S. PATENT DOCUMENTS 9,082,357 B2\* 7/2015 Nakagawa ........... G09G 3/3614
2014/0118657 A1\* 5/2014 Duan ................ G02F 1/136286
349/46

FOREIGN PATENT DOCUMENTS

JP 2013-117674 A 6/2013
KR 10-2013-0000997 A 1/2013

\* cited by examiner

*Primary Examiner* — Thoi Duong
(74) *Attorney, Agent, or Firm* — Anova Law Group, PLLC

(57) ABSTRACT

A pixel structure is disclosed. The pixel structure includes a plurality of data lines arranged in a first direction, and a plurality of gate lines arranged in a second direction. The plurality of data lines intersect with the plurality of gate lines near a plurality of sub-pixels. In addition, each of the plurality of sub-pixels includes a thin film transistor, and a pixel electrode. The plurality of sub-pixels includes a plurality of first rows of sub-pixels, and a plurality of second rows of sub-pixels, where the first rows of sub-pixels and the second rows of sub-pixels are interleaved, each sub-pixel in the first rows of sub-pixels is provided with a signal over a second-closest data line, and each sub-pixel in the second rows of sub-pixels is provided with a signal over a first-closest data line.

18 Claims, 22 Drawing Sheets

(51) Int. Cl.
  *G02F 1/1362* (2006.01)
  *G02F 1/1343* (2006.01)
  *H01L 29/786* (2006.01)
  *G09G 3/36* (2006.01)

(52) U.S. Cl.
  CPC ............... H01L 27/326; G02F 1/136286;
    G02F 1/1368; G02F 1/134309; G02F
    1/134336; G02F 1/13439; G02F 1/133;
    G02F 1/13306; G02F 1/1362; G02F 1/141;
    G02F 1/136; G02F 1/0516; G02F 1/0121;
    G02F 2001/134345; G02F 1/133514
    *G02F 1/136286* (2013.01); *G09G 3/3614*
    (2013.01); *H01L 29/786* (2013.01); *G02F
    2001/134345* (2013.01); *G09G 2300/0426*
    (2013.01); *G09G 2300/0452* (2013.01)

(58) Field of Classification Search
  USPC ....... 257/72; 345/205, 204, 214, 92; 349/43,
      349/37, 42, 139, 106
  See application file for complete search history.

PIXEL STRUCTURE, LIQUID CRYSTAL DISPLAY ARRAY SUBSTRATE AND LIQUID CRYSTAL DISPLAY PANEL

CROSS-REFERENCES TO RELATED APPLICATIONS

This application claims the benefit of priority to Chinese Patent Application No. 201410308998.1, filed with the Chinese Patent Office on Jun. 30, 2014 and entitled "PIXEL STRUCTURE, LIQUID CRYSTAL DISPLAY ARRAY SUBSTRATE AND LIQUID CRYSTAL DISPLAY PANEL", the content of which is incorporated herein by reference in its entirety.

FIELD OF THE INVENTION

The present invention relates to the field of liquid crystal displays and particularly to a pixel structure for a liquid crystal display.

BACKGROUND OF THE INVENTION

Liquid Crystal Displays (LCDs) have been widely applied to our life in respective aspects ranging from small-sized handsets, video cameras and digital cameras to middle-sized notebook PCs and desktop PCs further to large-sized home TV sets and large projectors, etc., and in particular, thin film transistor LCDs have become predominant in the market of displays due to their perfect pictures and rapid response characteristic in addition to their advantages of a low weight and slimness.

A pixel structure which is one of core components of a thin film transistor LCD poses a direct influence upon the aspect ratio, the response speed, the quality of a display picture and other aspects of the liquid crystal display, but it is desirable to further improve the pixel structure of the liquid crystal display in a number of aspects despite the ongoing in-depth study thereon.

Polarity inversion is required to drive the liquid crystal display, where an electric field applied to the liquid crystal molecules is directional, and polarity inversion refers to the application of the electric field to the liquid crystals in a direction being inverted over time for the purpose of obviating residual direct current of the liquid crystals. Common polarity inversion patterns of an array of pixels include frame inversion, column inversion, row inversion and point inversion. Since the voltage at pixels in the same row is written sequentially over different data lines whereas both the voltage at pixels in the same column is written sequentially over the same data line, row inversion and point inversion require a signal over a data line for input per row to be converted between positive and negative potential differences, thus resulting in high power consumption and complicating the data signal. Column inversion does not require the data signal for input per row to be converted between the positive and negative potential differences, thus resulting in low power consumption. However an advantage of point inversion lies in that point inversion comes with the lowest flickering among the inversion patterns while addressing residual direct current of the liquid crystals, thus resulting in the best display effect of an image in point inversion, and also the use of different polarity inversions between adjacent pixels further contributes to the elimination of a crosstalk which is an improper display arising from the adjacent pixels with similar voltage polarities. The pixel structure of the liquid crystal display can be modified for point inversion at low power consumption to achieve a better display effect.

The arrangement of sub-pixels is also an important factor influencing the display effect, and the sub-pixels are arranged typically in three colors of red, green and blue or sometimes in four colors of red, green, blue and white in the existing displays in a number of arrangement orders, where a monochromatic picture may fail to be displayed making it difficult to inspect visually a display screen with sub-pixels being arranged in difficult colors between sub-pixels in the same column.

BRIEF SUMMARY OF THE INVENTION

One inventive aspect is a pixel structure. The pixel structure includes a plurality of data lines arranged in a first direction, and a plurality of gate lines arranged in a second direction. The plurality of data lines intersect with the plurality of gate lines near a plurality of sub-pixels. In addition, each of the plurality of sub-pixels includes a thin film transistor, and a pixel electrode. The plurality of sub-pixels includes a plurality of first rows of sub-pixels, and a plurality of second rows of sub-pixels, where the first rows of sub-pixels and the second rows of sub-pixels are interleaved, each sub-pixel in the first rows of sub-pixels is provided with a signal over a second-closest data line, and each sub-pixel in the second rows of sub-pixels is provided with a signal over a first-closest data line.

DETAILED DESCRIPTION OF THE PREFERRED EMBODIMENTS

In order to make the disclosure of the invention more apparent, the invention will be described below with reference to particular embodiments thereof and the drawings, but the particular embodiments and the drawings below are not intended to limit the invention, and those ordinarily skilled in the art can make numerous modifications and variations thereto without departing from the principle and the scope of the invention, so the scope of the invention shall be as defined in the appended claims.

Figure 1A:
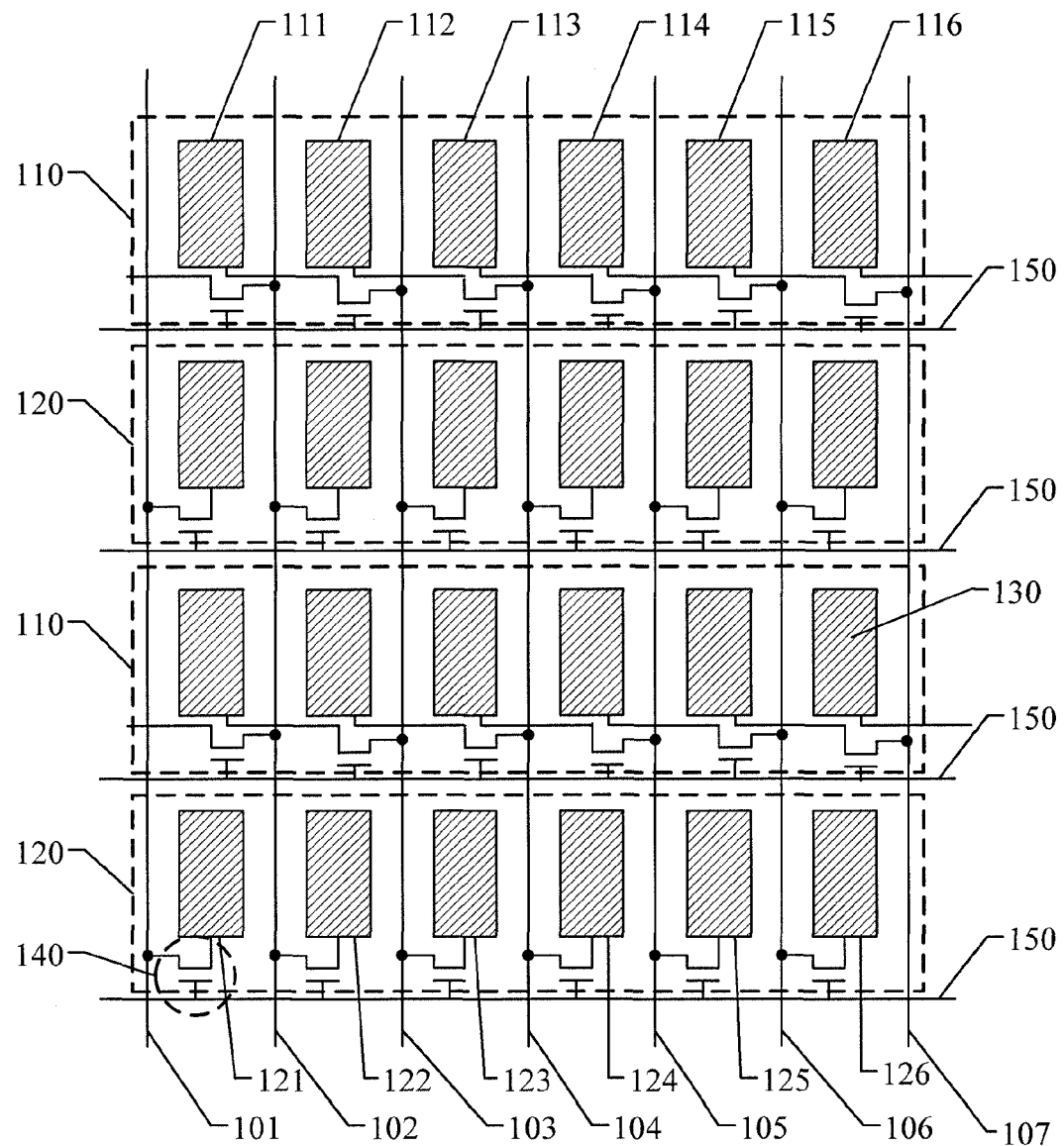
FIG. 1(a) is a schematic diagram of a pixel structure according to a first embodiment of the invention.

FIG. 1(a) is a schematic diagram of a pixel structure according to a first embodiment of the invention, and referring to FIG. 1(a), the pixel structure according to the first embodiment of the invention includes: a plurality of data lines, e.g., data lines 101, 102, 103, 104, 105, 106 and 107, arranged side by side in a first direction; and a plurality of gate lines, e.g., a plurality of gate lines 150 arranged side by side in a second direction, the plurality of data lines 101, 102, 103, 104, 105, 106 and 107 intersecting with the plurality of gate lines 150 to define a plurality of sub-pixels, each of which includes a thin film transistor 140 and a pixel electrode 130.

The plurality of sub-pixels include first rows of sub-pixels 110 and second rows of sub-pixels 120, where the first rows of sub-pixels 110 and the second rows of sub-pixels 120 are arranged alternatively.

Each sub-pixel in the first rows of sub-pixels 110 is provided with a signal over a second-closest data line; and each sub-pixel in the second rows of sub-pixels 120 is provided with a signal over a first-closest data line.

The first rows of sub-pixels 110 and the second rows of sub-pixels 120 in the embodiment of the invention will not be limited to the first rows of sub-pixels 110 arranged above and the second rows of sub-pixels 120 arranged below, but the first rows of sub-pixels 110 and the second rows of sub-pixels 120 can be arranged in a reverse order.

For the convenience of identification, each sub-pixel in the first rows of sub-pixels will be referred to as a first sub-pixel, and particularly the first rows of sub-pixels 110 illustrated in FIG. 1(a) includes first sub-pixels 111, 112, 113, 114, 115 and 116, each of which is provided with a signal over a second-closest data line on right side thereof. For example, the data line 102 is the first-closest data line on right side of the first sub-pixel 111, and the data line 103 is the second-closest data line on right side of the first sub-pixel 111, so the first sub-pixel 111 is provided with a signal over the data line 103. The data line 105 is the second-closest data line on right side of the first sub-pixel 113, so the first sub-pixel 113 is provided with a signal over the data line 105.

The data line 102 is the second-closest data line on left side of the first sub-pixel 113, and the first sub-pixel 113 can be provided with a signal over the data line 102 in another implementation of the first embodiment of the invention, that is, the first sub-pixel can be provided with a signal over the second-closest data line on left side of the first sub-pixel in the other implementation.

For the convenience of identification, each sub-pixel in the second rows of sub-pixels will be referred to as a second sub-pixel, and particularly the second rows of sub-pixels 120 illustrated in FIG. 1(a) includes second sub-pixels 121, 122, 123, 124, 125 and 126, each of which is provided with a signal over a first-closest data line on left side thereof. For example, the data line 101 is the first-closest data line on left side of the second sub-pixel 121, so the second sub-pixel 121 is provided with a signal over the data line 101.

The data line 102 is the first-closest data line on right side of the second sub-pixel 121, and the second sub-pixel 121 can be provided with a signal over the data line 102 in another implementation of the first embodiment of the invention, that is, the second sub-pixel can be provided with a signal over the first-closest data line on right side of the second sub-pixel in another implementation.

Of course, the number of data lines, the number of rows of sub-pixels and the number of sub-pixels in the pixel structure according to the first embodiment of the invention will not be limited to those illustrated in FIG. 1(a) but can be more or less than those illustrated in FIG. 1(a).

Polarity inversion is required to drive the liquid crystal display so as to avoid residual direct current of the liquid crystals, and the first sub-pixels and the second sub-pixels in the same column are not provided with signals over the same data line in the pixel structure according to the first embodiment of the invention, so point inversion of an array of sub-pixels can be performed by inputting simple signals over a data line. Point inversion comes with the lowest flickering among the inversion patterns while addressing residual direct current of the liquid crystals, thus resulting in the best display effect of an image in point inversion. Also different polarities between adjacent sub-pixels further contribute to the elimination of a crosstalk which is an improper display arising from the adjacent sub-pixels with similar voltage polarities. For point inversion in the case that sub-pixels in the same column are connected with the same data line, high and low voltage signals need to be input alternatively per row over the data line, thus complicating a signal and greatly increasing power consumption. Thus the pixel structure according to the first embodiment of the invention can achieve the effect of point inversion with simple signals advantageously at low power consumption.

Several different schemes to drive the pixel structure according to the first embodiment of the invention will be described below.

Figure 1B:
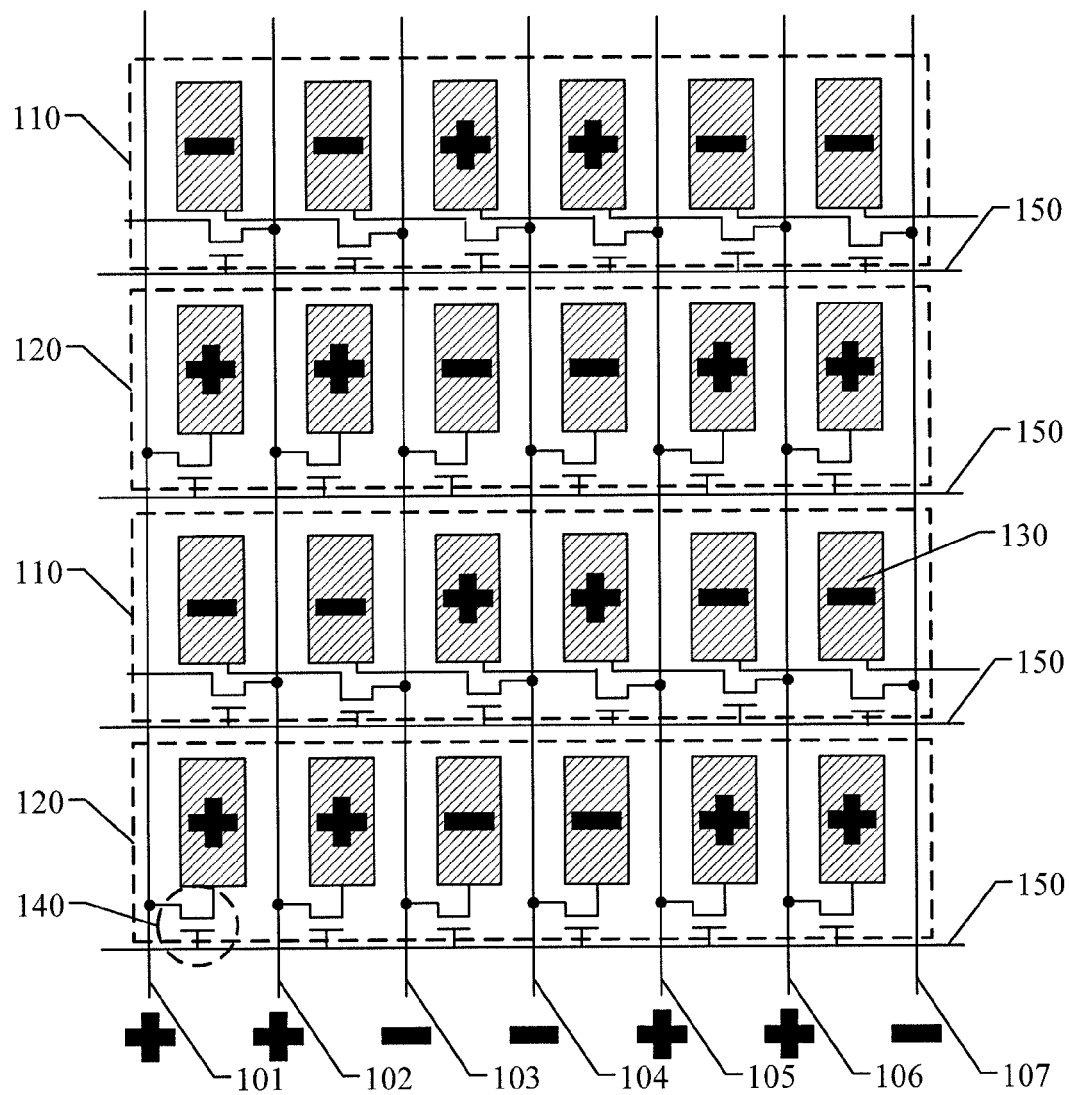
FIG. 1(b) is a schematic diagram of polarity inversion in a first implementation of the first embodiment of the invention.

FIG. 1(b) is a schematic diagram of polarity inversion in a first implementation of the first embodiment of the invention, and the pixel structure illustrated in FIG. 1(b) is the pixel structure illustrated in FIG. 1(a), so a repeated description of the particular structure will be omitted here. A polarity inversion pattern of the pixel structure will be described particularly with reference to FIG. 1(b) where the sign "+" represents an input positive potential difference signal, and the sign "−" represents an input negative potential difference signal, and the potential difference refers to the difference in voltage between a voltage provided over a data line and a common voltage. Generally the common voltage is constant, so the polarity of the potential difference is considered here as a function of a signal input over the data line.

In this implementation, a first sub-pixel is provided with a signal over a second-closest data line on right side of the first sub-pixel, and also a second sub-pixel is provided with a signal over a first-closest data line on left side of second sub-pixel; and two adjacent data lines constitute a group, and potential differences of two adjacent groups of data lines are opposite in polarity. Two-point inversion of the array of pixels can be performed with data signals input in this drive scheme in the pixel structure in this implementation. Two-point inversion of the array of pixels refers to two adjacent sub-pixels constituting a group and two adjacent groups of sub-pixels opposite in polarity Particularly in FIG. 1(b), the data line 101 and the data line 102 are a group over which a positive potential difference signal is input; the data line 103 and the data line 104 are a group over which a negative potential difference signal is input; and the data line 105 and the data line 106 are a group over which a positive potential difference signal is input. As presented throughout the array of pixels here, two adjacent sub-pixels constitute a group, and one group is provided with a positive potential difference signal whereas the other group is provided with a negative potential difference signal so that two adjacent groups of sub-pixels are opposite in polarity.

In the next frame, all the positive potential difference signals are changed to negative potential difference signals, and all the negative potential difference signals are changed to positive potential difference signals, for example, negative potential difference signals are input over the data line 101, the data line 102, the data line 105 and the data line 106, and positive potential difference signals are input over the data line 103 and the data line 104, so that all the sub-pixels are provided with the signals at the positive and negative polarities being swapped, and the polarity of the two sub-pixels in the same group is inverted.

Thus the effect of two-point inversion of the array of pixels can be achieved with the signals input as in this implementation at low power consumption simply in the drive scheme in the pixel structure in this implementation.

Figure 2:
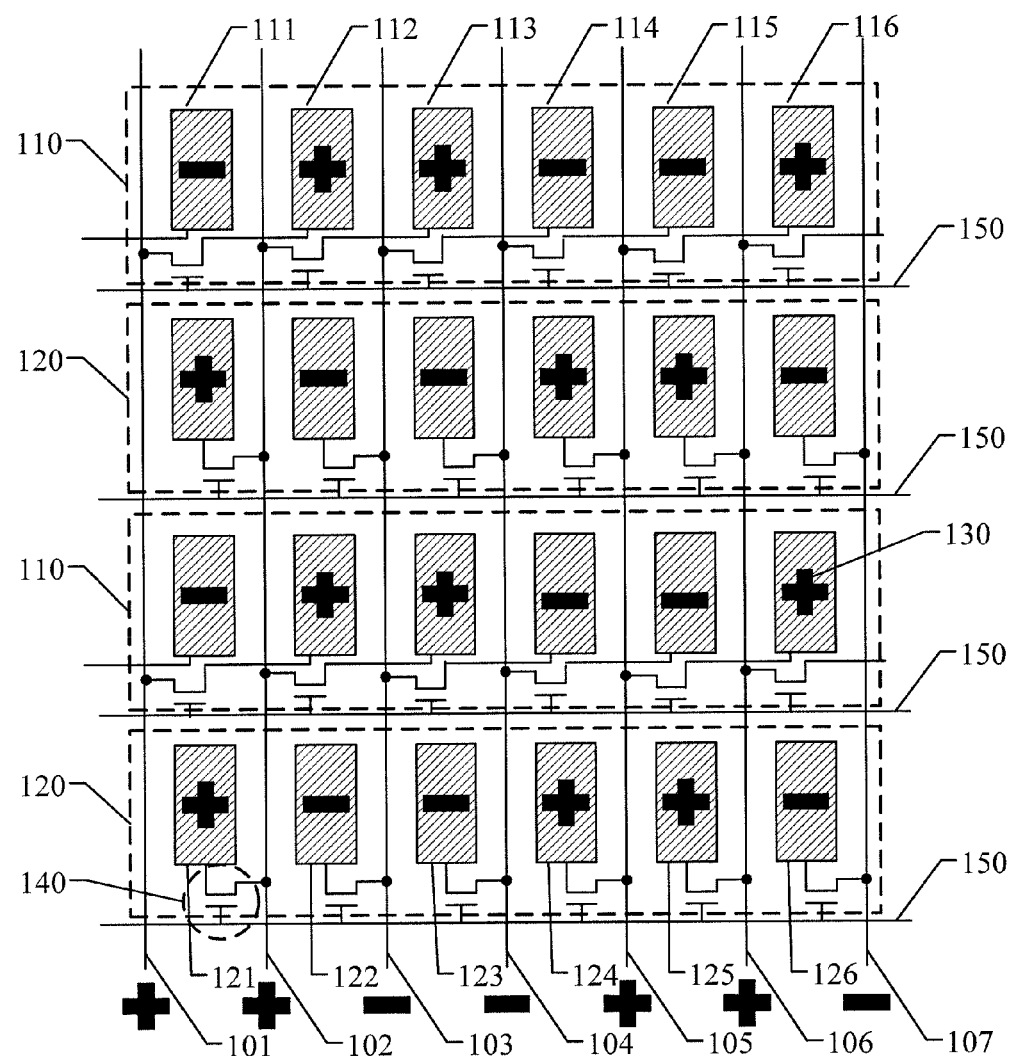
FIG. 2 is a schematic diagram of polarity inversion in a second implementation of the first embodiment of the invention.

FIG. 2 is a schematic diagram of polarity inversion in a second implementation of the first embodiment of the invention, and reference to FIG. 2, a repeated description of the same aspects of this implementation as those in the other implementation above will be omitted here except that a first sub-pixel is provided with a signal over a second-closest data line on left side of first sub-pixel and also a second sub-pixel is provided with a signal over a first-closest data line on right side of the second sub-pixel in the second implementation. In FIG. 2, for example, the data line 102 is the second-closest data line on left side of the first sub-pixel 113, so the first sub-pixel 113 is provided with a signal over the data line 102; and the data line 103 is the first-closest data line on right side of the second sub-pixel 122, so the second sub-pixel 122 is provided with a signal over the data line 103.

Two-point inversion of the array of pixels can also be performed as in the drive scheme in the first implementation in the pixel structure in the second implementation. For example, the data line 101 and the data line 102 are a group over which a positive potential difference signal is input; the data line 103 and the data line 104 are a group over which a negative potential difference signal is input; and the data line 105 and the data line 106 are a group over which a positive potential difference signal is input. As presented throughout the array of pixels here, two adjacent sub-pixels constitute a group, and one group is provided with a positive potential difference signal whereas the other group is provided with a negative potential difference signal so that two adjacent groups of sub-pixels are opposite in polarity.

In the next frame, all the positive potential difference signals are changed to negative potential difference signals, and all the negative potential difference signals are changed to positive potential difference signals. For example, negative potential difference signals are input over the data line 101, the data line 102, the data line 105 and the data line 106, and positive potential difference signals are input over the data line 103, the data line 104, and the data line 107, so that all the sub-pixels are provided with the signals at the positive and negative polarities being swapped, and the polarity of the two sub-pixels in the same group is inverted. Thus the effect of two-point inversion of the array of pixels can be achieved with the signals input as in this implementation in the pixel structure in this implementation.

The effect of two-point inversion of the array of pixels can be achieved with the simple input signals at low power consumption simply in the drive scheme in the pixel structure in the second implementation of the first embodiment of the invention.

Figure 3:
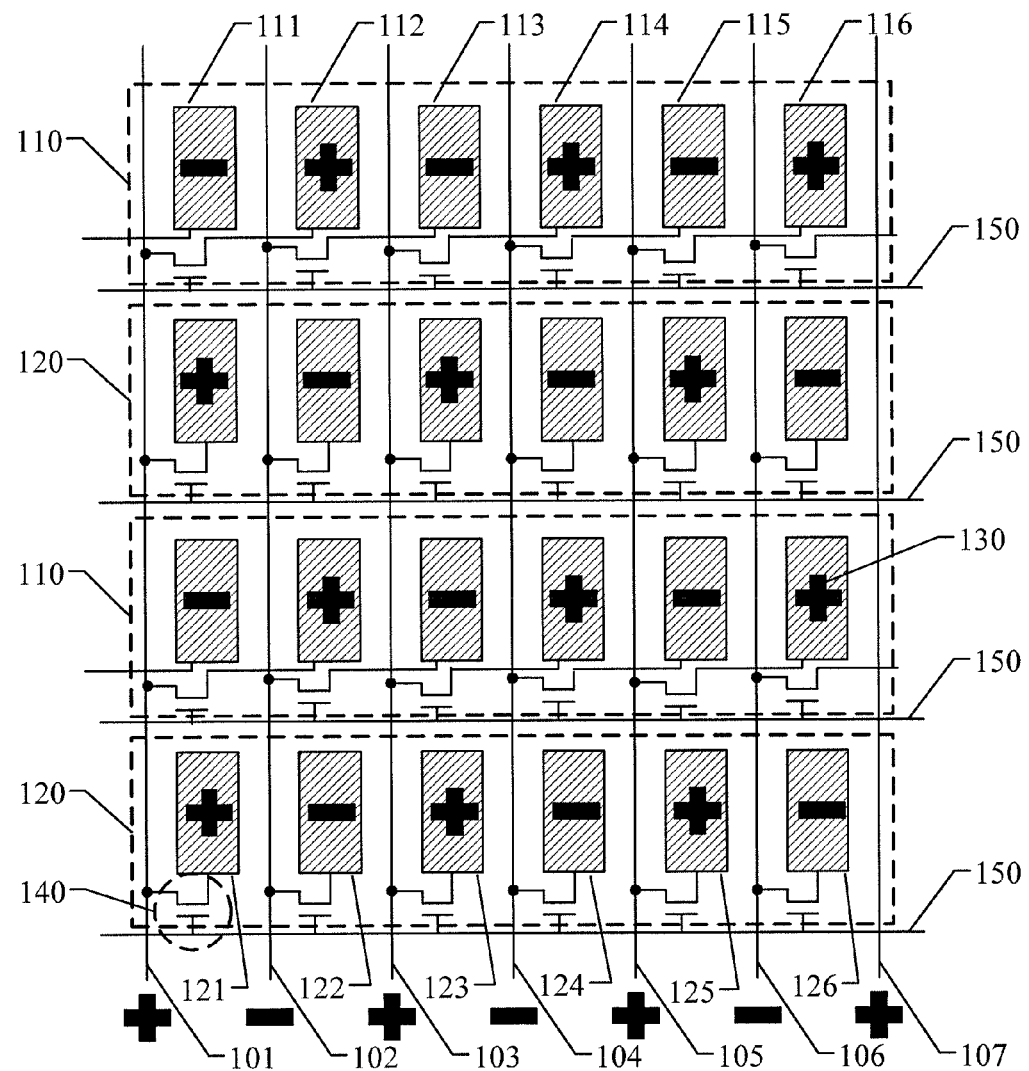
FIG. 3 is a schematic diagram of polarity inversion in a third implementation of the first embodiment of the invention.

FIG. 3 is a schematic diagram of polarity inversion in a third implementation of the first embodiment of the invention, and reference to FIG. 3, a repeated description of the same aspects of this implementation as those in the other implementations above will be omitted here except that a first sub-pixel is provided with a signal over a second-closest data line on left side of first sub-pixel and also a second sub-pixel is provided with a signal over a first-closest data line on left side of second sub-pixel in the third implementation. In FIG. 3, for example, the data line 102 is the second-closest data line on left side of the first sub-pixel 113, so the first sub-pixel 113 is provided with a signal over the data line 102; and the data line 102 is the first-closest data line on left side of the second sub-pixel 122, so the second sub-pixel 122 is provided with a signal over the data line 102.

In FIG. 3, the sign "+" represents an input positive potential difference signal, and the sign "−" represents an input negative potential difference signal. Potential difference signals input over two adjacent data lines are opposite in the third implementation. Point inversion of the array of pixels can be performed in the drive scheme in the pixel structure in this implementation, and the signals in this implementation are simpler and consume less power than point inversion in the prior art.

Particularly in FIG. 3, positive potential difference signals are input over the data line 101, the data line 103, the data line 105 and the data line 107, and negative potential difference signals are input over the data line 102, the data line 104 and the data line 106, and as presented throughout the array of pixels here, the respective sub-pixels are provided with the positive and negative potential difference signals, and each sub-pixel is provided with a potential difference signal opposite to that of a sub-pixel adjacent in the same column or the same row. In the next frame, all the positive potential difference signals are changed to negative potential difference signals, and all the negative potential difference signals are changed to positive potential difference signals, so that negative potential difference signals are input over the data line 101, the data line 103, the data line 105 and the data line 107, and positive potential difference signals are input over the data line 102, the data line 104 and the data line 106, so all the sub-pixels are provided with the signals at the positive and negative polarities being inverted, but the positive and negative signals of the respective pixels still occur alternately.

Figure 4:
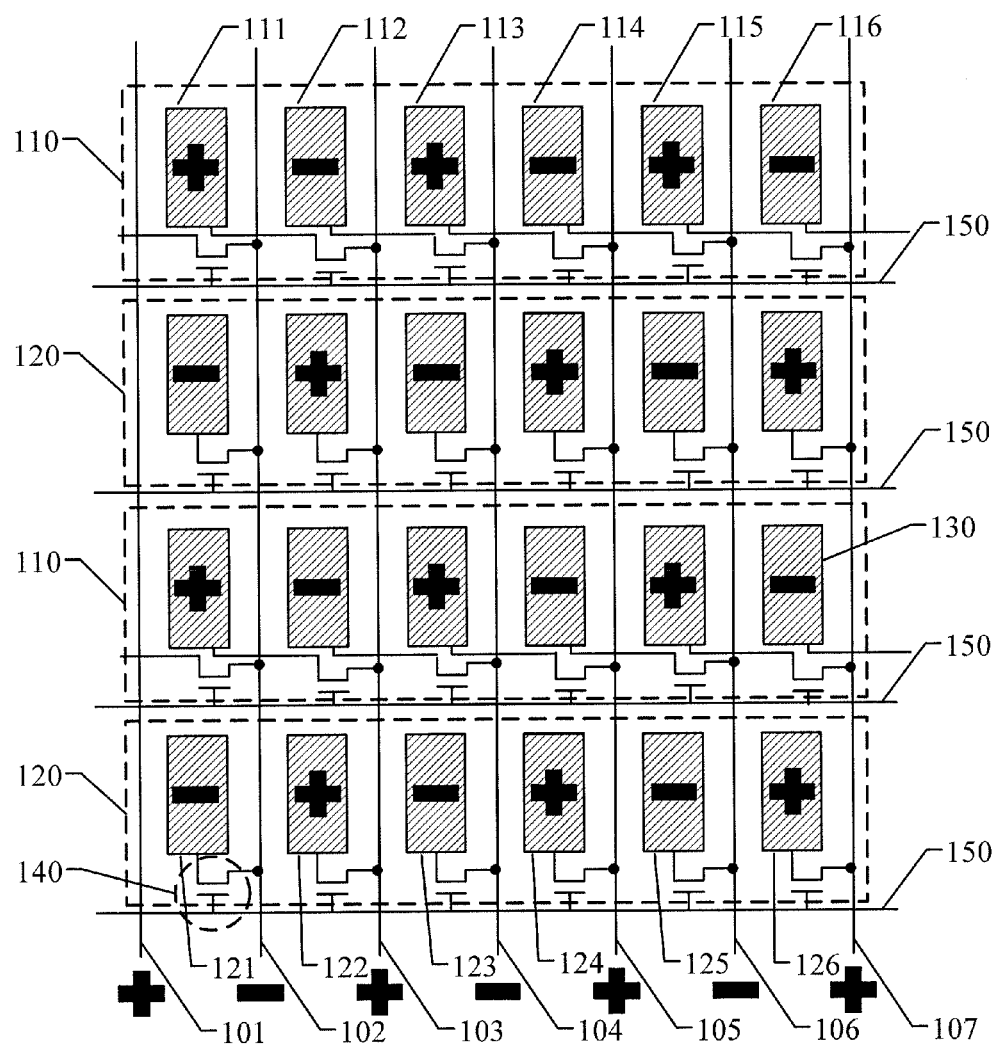
FIG. 4 is a schematic diagram of polarity inversion in a fourth implementation of the first embodiment of the invention.

FIG. 4 is a schematic diagram of polarity inversion in a fourth implementation of the first embodiment of the invention, and reference to FIG. 4, a repeated description of the same aspects of this implementation as those in the other implementations above will be omitted here except that a first sub-pixel is provided with a signal over a second-closest data line on right side of the first sub-pixel and also a second sub-pixel is provided with a signal over a first-closest data line on right side of the second sub-pixel in the fourth implementation. For example, the data line 105 is the second-closest data line on right side of the first sub-pixel 113, so the first sub-pixel 113 is provided with a signal over the data line 105; and the data line 103 is the first-closest data line on right side of the second sub-pixel 122, so the second sub-pixel 122 is provided with a signal over the data line 103.

Two-point inversion of the array of pixels can also be performed as in the drive scheme in the third implementation in the pixel structure in the fourth implementation. For example, positive potential difference signals are input over the data line 101, the data line 103, the data line 105 and the data line 107, and negative potential difference signals are input over the data line 102, the data line 104 and the data line 106, and as presented throughout the array of pixels here, the respective sub-pixels are provided with the positive and negative potential difference signals, and each sub-pixel is provided with a potential difference signal opposite to that of a sub-pixel adjacent in the same column or the same row. In the next frame, all the positive potential difference signals are changed to negative potential difference signals, and all the negative potential difference signals are changed to positive potential difference signals, so that negative potential difference signals are input over the data line 101, the data line 103, the data line 105 and the data line 107, and positive potential difference signals are input over the data line 102, the data line 104 and the data line 106, so all the sub-pixels are provided with the signals at the positive and negative polarities being inverted, but the positive and negative signals of the respective pixels still occur alternately, so the effect of point inversion of the array of pixels can be achieved with the signals input as in the third implementation in the pixel structure in this implementation.

A second embodiment of the invention provides a pixel structure, and in the second embodiment, in each sub-pixel in first rows of sub-pixels, a pixel electrode is electrically connected with the drain of a thin film transistor of a sub-pixel on left side of the each sub-pixel in first rows of sub-pixels, and the source of the thin film transistor is electrically connected with a first-closest data line on left side of the each sub-pixel in first rows of sub-pixels; or in each sub-pixel in the first rows of sub-pixels, a pixel electrode is electrically connected with the drain of a thin film transistor of a sub-pixel on right side of the each sub-pixel in the first rows of sub-pixels, and the source of the thin film transistor is electrically connected with a first-closest data line on right side of the each sub-pixel in the first rows of sub-pixels.

In each sub-pixel in the second rows of sub-pixels, a pixel electrode is electrically connected with the drain of a thin film transistor, and the source of the thin film transistor is electrically connected with a first-closest data line on left side of or on right side of the each sub-pixel in the second rows of sub-pixels.

FIG. 5(*a*) is a schematic diagram of a pixel structure in a first implementation of a second embodiment of the invention, and referring to FIG. 5(*a*), there is illustrated a connection pattern between a pixel electrode, a thin film transistor and a data line.

In FIG. 5(*a*), a first row of sub-pixels 210 includes first sub-pixels 211, 212, 213, 214, 215 and 216, and a pixel electrode 230 of each of the first sub-pixels is electrically connected with the drain 241 of a thin film transistor 240 of a sub-pixel on right side of the each of the first sub-pixels, and the source 242 of the thin film transistor 240 is electrically connected with a first-closest data line on right side of the each of the first sub-pixels. For example, the pixel electrode 230 of the first sub-pixel 211 is electrically connected with the drain 241 of the thin film transistor 240 of the first sub-pixel 212 on right side of the first sub-pixel 211, and the source 242 of the thin film transistor 240 of the first sub-pixel 212 is electrically connected with the first-closest data line on right side of the first sub-pixel 212, i.e., the data line 203. Thus the first sub-pixel 211 is provided with a signal over the data line 203, that is, a first sub-pixel is provided with a signal over a second-closest data line on right side of the first sub-pixel.

A second row of sub-pixels 220 includes second sub-pixels 221, 222, 223, 224, 225 and 226, and a pixel electrode 230 of each of the second sub-pixels is electrically connected with the drain 241 of a thin film transistor 240 in the same second sub-pixel, and the source 242 of the thin film transistor 240 is electrically connected with a first-closest data line on left side of the each of the second sub-pixels. For example, the pixel electrode 230 of the second sub-pixel 222 is electrically connected with the drain 241 of the thin film transistor 240 of the second sub-pixel 222, and the source 242 of the thin film transistor 240 of the second sub-pixel 222 is electrically connected with the first-closest data line on left side of second sub-pixel 222, i.e., the data line 202. Thus the second sub-pixel 222 is provided with a signal over the data line 202, that is, a second sub-pixel is provided with a signal over a first-closest data line on left side of second sub-pixel 222.

Alike there are three other implementations in the second embodiment, which will be described below respectively.

In another implementation, referring to FIG. 5(*b*), there is illustrated a schematic diagram of a pixel structure in a second implementation of the second embodiment of the invention, and the second implementation of the second embodiment is different from the first implementation in that respective sub-pixels in a second row of sub-pixels 220 include second sub-pixels 221, 222, 223, 224, 225 and 226, and a pixel electrode 230 is electrically connected with the drain 241 of a thin film transistor 240 in the same second sub-pixel, and the source 242 of the thin film transistor 240 is electrically connected with a first-closest data line on right side of the same second sub-pixel. For example, the pixel electrode 230 of the second sub-pixel 222 is electrically connected with the drain 241 of the thin film transistor 240 of the second sub-pixel 222, and the source 242 of the thin film transistor 240 of the second sub-pixel 222 is electrically connected with the first-closest data line on right side of the second sub-pixel 222, i.e., the data line 203. Thus the second sub-pixel 222 is provided with a signal over the data line 203, that is, a second sub-pixel is provided with a signal over a first-closest data line on right side of the second sub-pixel 222.

Figure 5A:
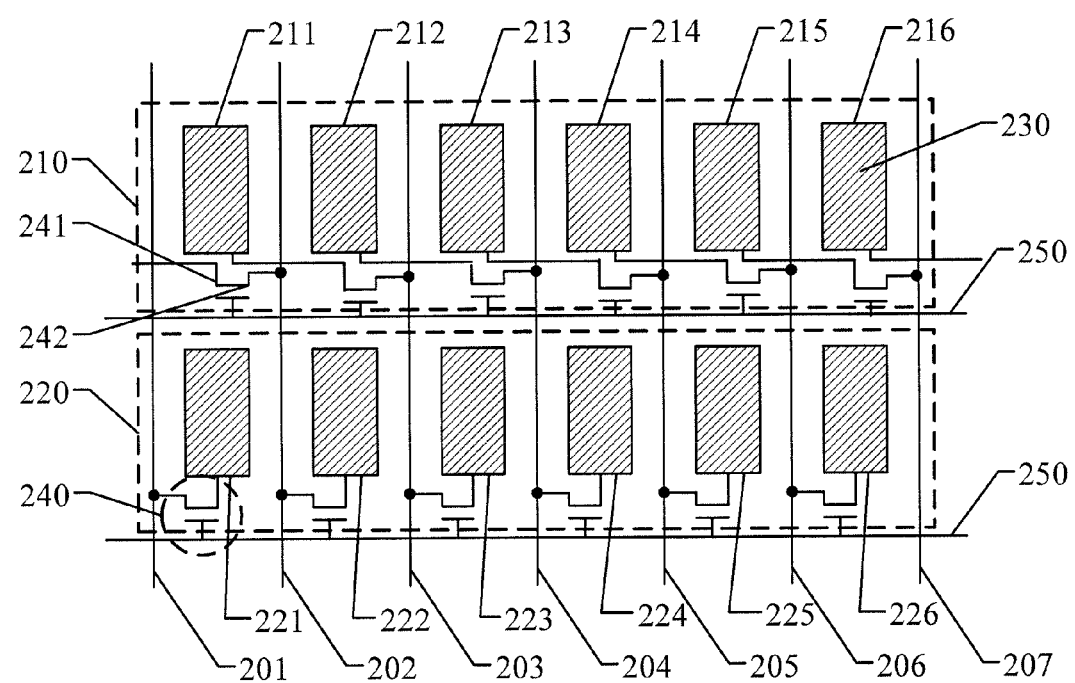
FIG. 5(a) is a schematic diagram of a pixel structure in a first implementation of a second embodiment of the invention.
Figure 5B:
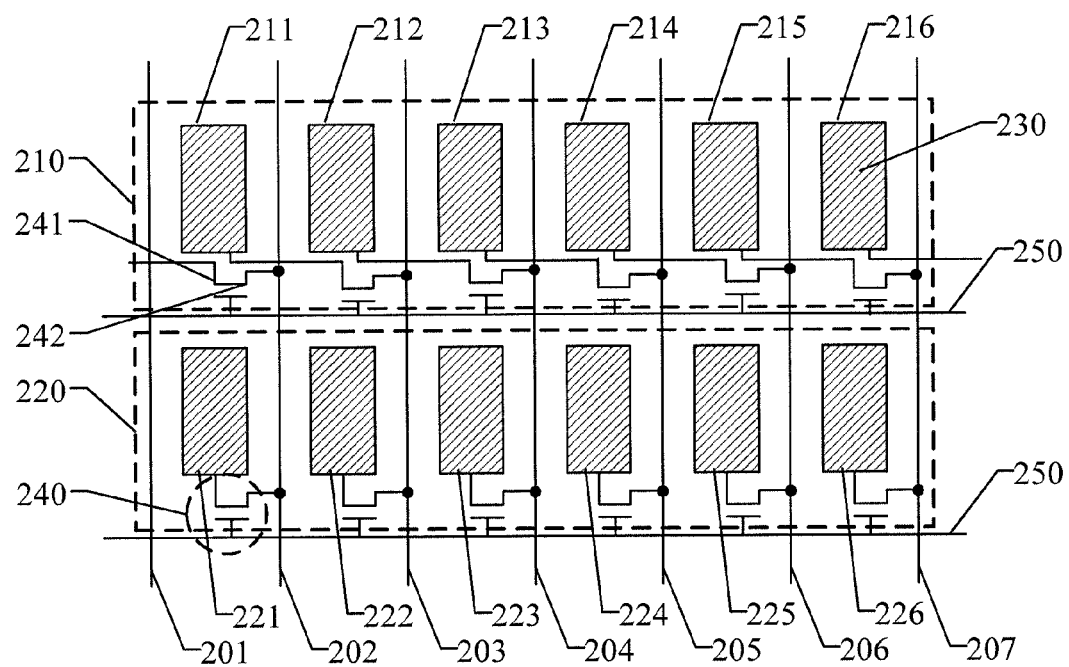
FIG. 5(b) is a schematic diagram of a pixel structure in a second implementation of the second embodiment of the invention.
Figure 5C:
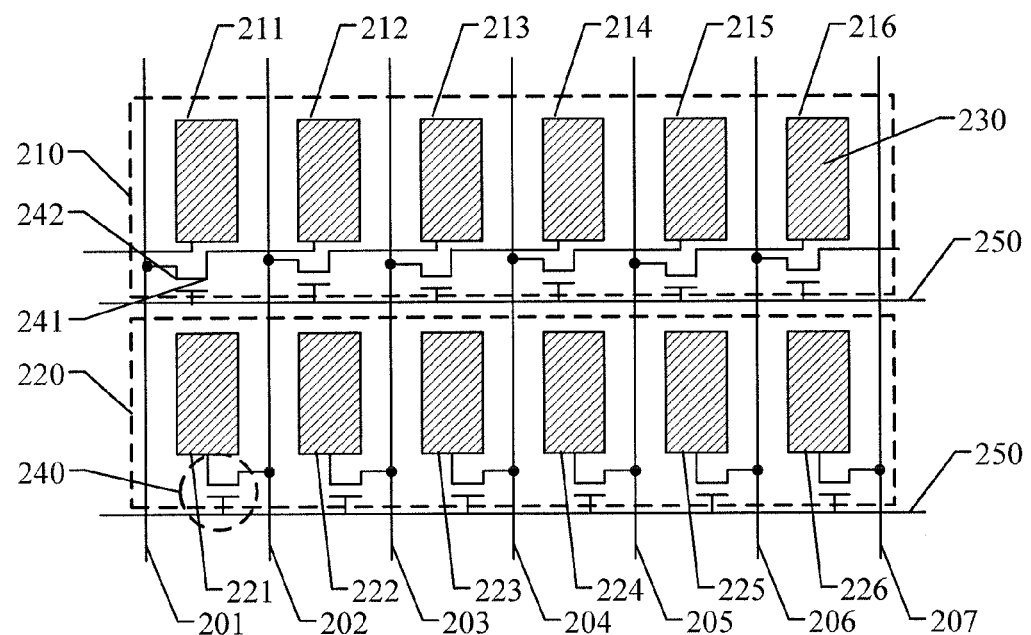
FIG. 5(c) is a schematic diagram of a pixel structure in a third implementation of the second embodiment of the invention.

Alternatively referring to FIG. 5(c), there is illustrated a schematic diagram of a pixel structure in a third implementation of the second embodiment of the invention, and the third implementation is different from the first implementation in that a first row of sub-pixels 210 includes first sub-pixels 211, 212, 213, 214, 215 and 216, and a pixel electrode 230 of each of the first sub-pixels is electrically connected with the drain 241 of a thin film transistor 240 of a sub-pixel on left side of the each of the first sub-pixels, and the source 242 of the thin film transistor 240 is electrically connected with a first-closest data line on left side of the each of the first sub-pixels. For example, the pixel electrode 230 of the first sub-pixel 213 is electrically connected with the drain 241 of the thin film transistor 240 of the first sub-pixel 212 on left side of the first sub-pixel 213, and the source 242 of the thin film transistor 240 of the first sub-pixel 212 is electrically connected with the first-closest data line on left side of the first sub-pixel 213, i.e., the data line 202. Thus the first sub-pixel 212 is provided with a signal over the data line 202, that is, a first sub-pixel is provided with a signal over a second-closest data line adjacent on left side of the first sub-pixel.

Respective sub-pixels in a second row of sub-pixels 220 includes second sub-pixels 221, 222, 223, 224, 225 and 226, and a pixel electrode 230 is electrically connected with the drain 241 of a thin film transistor 240 in the same second sub-pixel, and the source 242 of the thin film transistor 240 is electrically connected with a first-closest data line on right side of the same second sub-pixel. For example, the pixel electrode 230 of the second sub-pixel 222 is electrically connected with the drain 241 of the thin film transistor 240 of the second sub-pixel 222, and the source 242 of the thin film transistor 240 of the second sub-pixel 222 is electrically connected with the first-closest data line on right side of the second sub-pixel 222, i.e., the data line 203. Thus the second sub-pixel 222 is provided with a signal over the data line 203, that is, a second sub-pixel is provided with a signal over a first-closest data line on right side of the second sub-pixel 222.

Figure 5D:
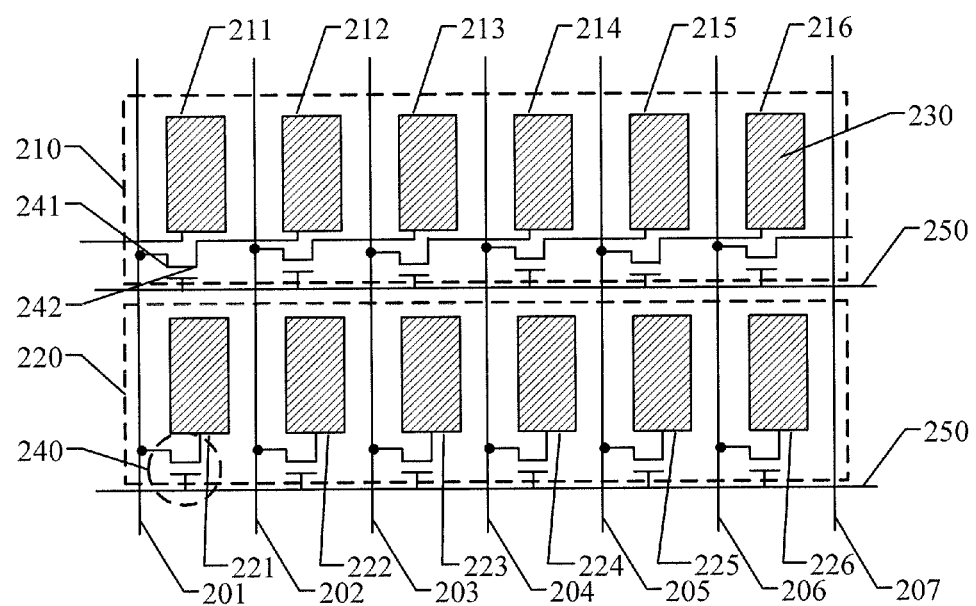
FIG. 5(d) is a schematic diagram of a pixel structure in a fourth implementation of the second embodiment of the invention.

Alternatively referring to FIG. 5(d), there is illustrated a schematic diagram of a pixel structure in a fourth implementation of the second embodiment of the invention, and the fourth implementation is different from the third implementation in that respective sub-pixels in a second row of sub-pixels 220 include second sub-pixels 221, 222, 223, 224, 225 and 226, and a pixel electrode 230 is electrically connected with the drain 241 of a thin film transistor 240 in the same second sub-pixel, and the source 242 of the thin film transistor 240 is electrically connected with a first-closest data line on left side of the same second sub-pixel. For example, the pixel electrode 230 of the second sub-pixel 222 is electrically connected with the drain 241 of the thin film transistor 240 of the second sub-pixel 222, and the source 242 of the thin film transistor 240 of the second sub-pixel 222 is electrically connected with the first-closest data line on left side of the second sub-pixel 222, i.e., the data line 202. Thus the second sub-pixel 222 is provided with a signal over the data line 202, that is, a second sub-pixel is provided with a signal over a first-closest data line on left side of the second sub-pixel.

Figure 6A:
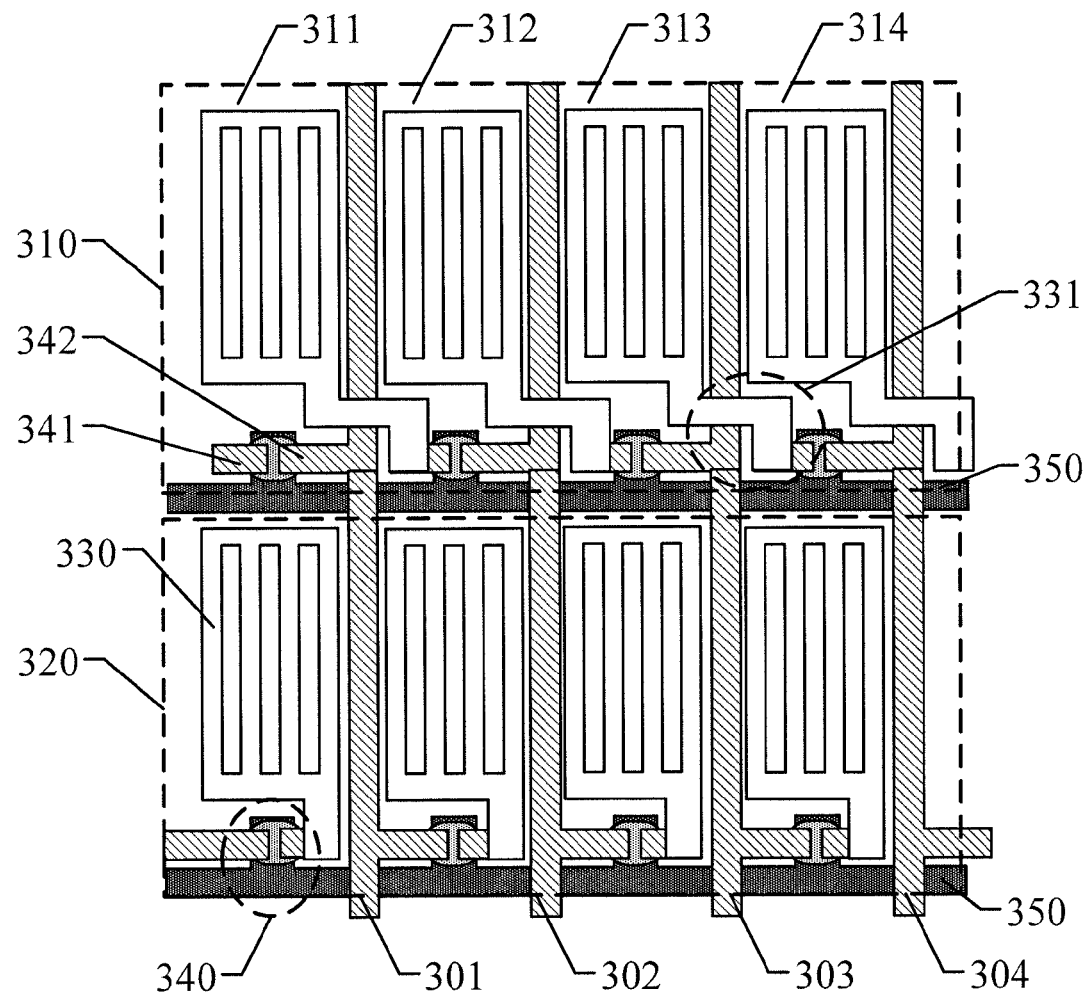
FIG. 6(a) is a schematic diagram of a pixel structure according to a third embodiment of the invention.

FIG. 6(a) is a schematic diagram of a pixel structure according to a third embodiment of the invention, and referring to FIG. 6(a), a connection pattern between a pixel electrode and a thin film transistor will be further described in the third embodiment of the invention based upon the second embodiment. A part of a pixel electrode 330 in each sub-pixel in a first row of sub-pixels 310 extends across a data line on right side of the each sub-pixel to be electrically connected with the drain 341 of a thin film transistor 340 of an adjacent sub-pixel.

The pixel structure illustrated in FIG. 6(a) includes data lines 301, 302, 303 and 304, and the first row of sub-pixels 310 includes first sub-pixels 311, 312, 313 and 314. For example, a part of the pixel electrode 330 of the first sub-pixel 311 extends forming a connection section 331, and the connection section 331 extends across the first-closest data line 301 to the proximity of the drain 341 of the thin film transistor 340 of the first sub-pixel 312 so that the connection section 331 contacts the drain 341, so the pixel electrode of the first sub-pixel 311 is electrically connected with the drain 341 of the thin film transistor 340 of the first sub-pixel 312 on right side of the first sub-pixel 311.

In the event that a pixel electrode of a first sub-pixel is connected with the drain of a thin film transistor of a sub-pixel on left side of the first sub-pixel, also a part of the pixel electrode extends forming a connection section, and the connection section extends across a first-closest data line on left side of the first sub-pixel to the proximity of the drain of a thin film transistor of a first sub-pixel on left side of the first sub-pixel so that the connection section contacts the drain to be electrically connected therewith.

In the pixel structure of the liquid crystal display, the pixel electrode 330 is typically made of a transparent electrically-conductive material, and the pixel electrode 330 is formed so that a part of the pixel electrode 330 extends out forming the connection section 331, and the connection section 331 extends to the proximity of the drain 341 of the thin film transistor 340 of the adjacent sub-pixel and is electrically connected with the drain 341, where the connection section 331 can extend across the data line above or below the data line. The connection section 331 can be fabricated along with the pixel electrode 330 to thereby save a process cost.

Figure 6B:
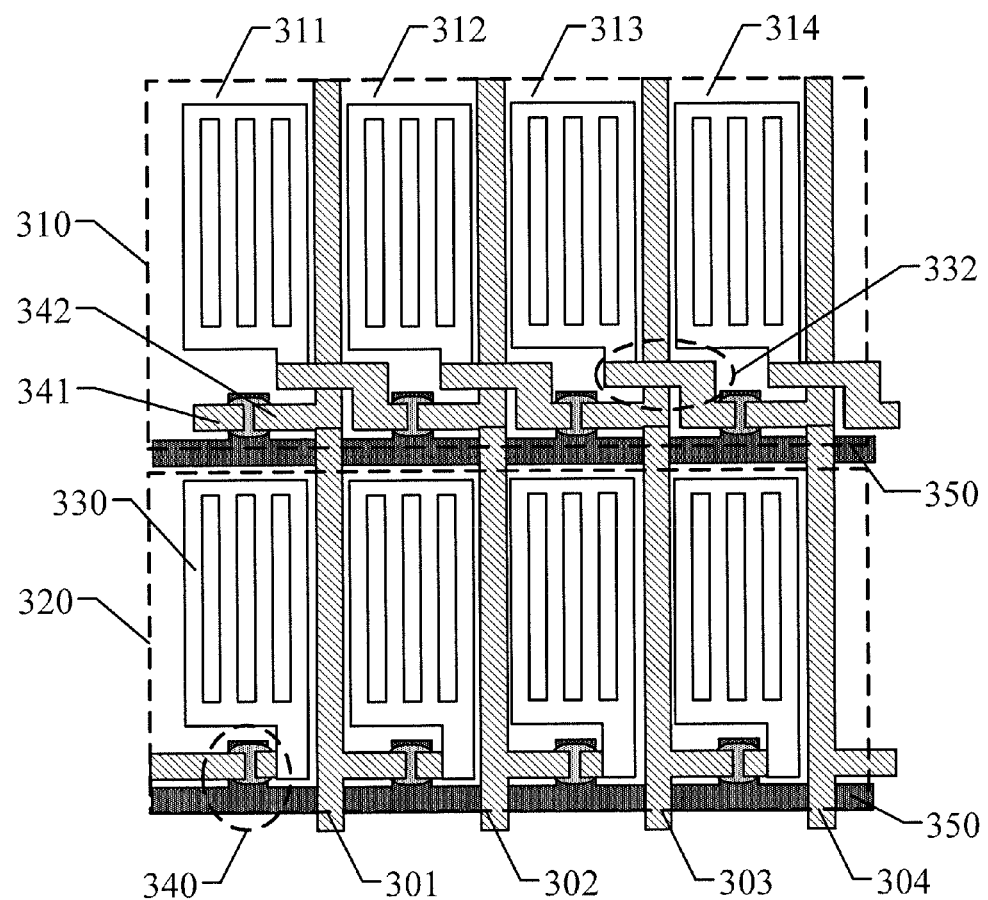
FIG. 6(b) is a schematic diagram of a pixel structure in another implementation of the third embodiment of the invention.

However the invention will not be limited to this connection pattern, and FIG. 6(b) is a schematic diagram of a pixel structure in another implementation of the third embodiment of the invention. Referring to FIG. 6(b), a repeated description of the same aspects of this implementation as those in the other implementation above will be omitted here except that a part of the drain of a thin film transistor extends forming a connection section 332. For example, a part of the drain 341 of the thin film transistor 340 of the first sub-pixel 312 extends forming the connection section 332, and the connection section 332 extends across the first-closest data line 301 on left side of the first sub-pixel 312 to the proximity of the pixel electrode 330 of the first sub-pixel 311 so that the connection section 332 contacts the pixel electrode 330, so the pixel electrode of the first sub-pixel 311 is electrically connected with the drain 341 of the thin film transistor 340 of the first sub-pixel 312 on right side of the first sub-pixel 311. In the event that a pixel electrode of a first sub-pixel is connected with the drain of a thin film transistor of a sub-pixel on left side of the first sub-pixel, also a part of drain of the thin film transistor extends forming a connection section, and the connection section extends across a first-closest data line on right side of the first sub-pixel to the proximity of a pixel electrode of another first sub-pixel on right side of the first sub-pixel so that the connection section contacts the pixel electrode to be electrically connected therewith.

Figure 6C:
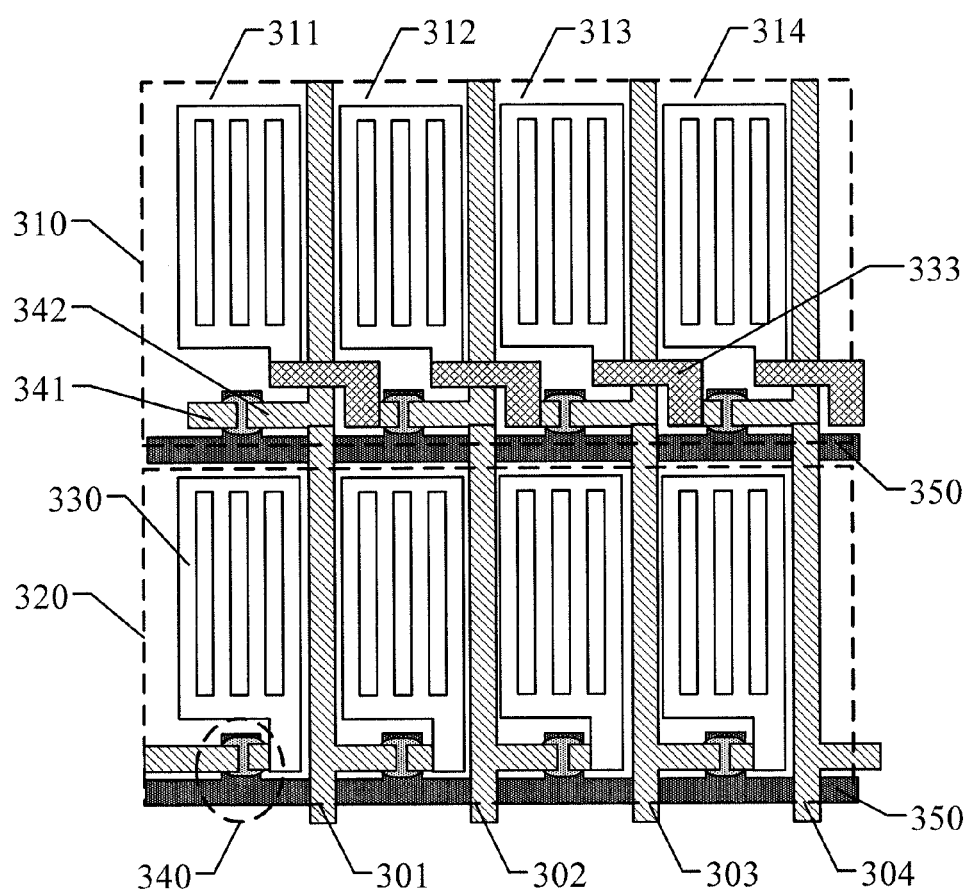
FIG. 6(c) is a schematic diagram of a pixel structure in still another implementation of the third embodiment of the invention.

FIG. 6(c) is a schematic diagram of a pixel structure in still another implementation of the third embodiment of the invention. Referring to FIG. 6(b), a repeated description of the same aspects of this implementation as those in the other implementations above will be omitted here except that a connection section 333 is formed separately so that a pixel electrode 330 is electrically connected with the drain 341 of a thin film transistor 340 by the electrically conductive connection section 333 formed separately instead of being formed along with the pixel electrode 330 or the drain 341. For example, one end of the connection section 333 of the first sub-pixel 311 is electrically connected with the pixel electrode 310 thereof, and the other end of the connection section 333 extends across the first-closest data line 301 on right side of the first sub-pixel 311 to be electrically connected with the drain 341 of the thin film transistor 340 of the first sub-pixel 312 so that the pixel electrode 330 of the first sub-pixel 311 is electrically connected with the drain 341 of the thin film transistor 340 of the first sub-pixel 312 on right side of the first sub-pixel 311. In the event that a pixel electrode of a first sub-pixel is connected with the drain of a thin film transistor of a sub-pixel on left side of the first sub-pixel, also a connection section can be electrically connected with a pixel electrode, and the connection section can extend to the proximity of the drain of a thin film transistor of a first sub-pixel on left side of the first sub-pixel so that the connection section contacts the drain of the thin film transistor to be electrically connected therewith.

Figure 7:
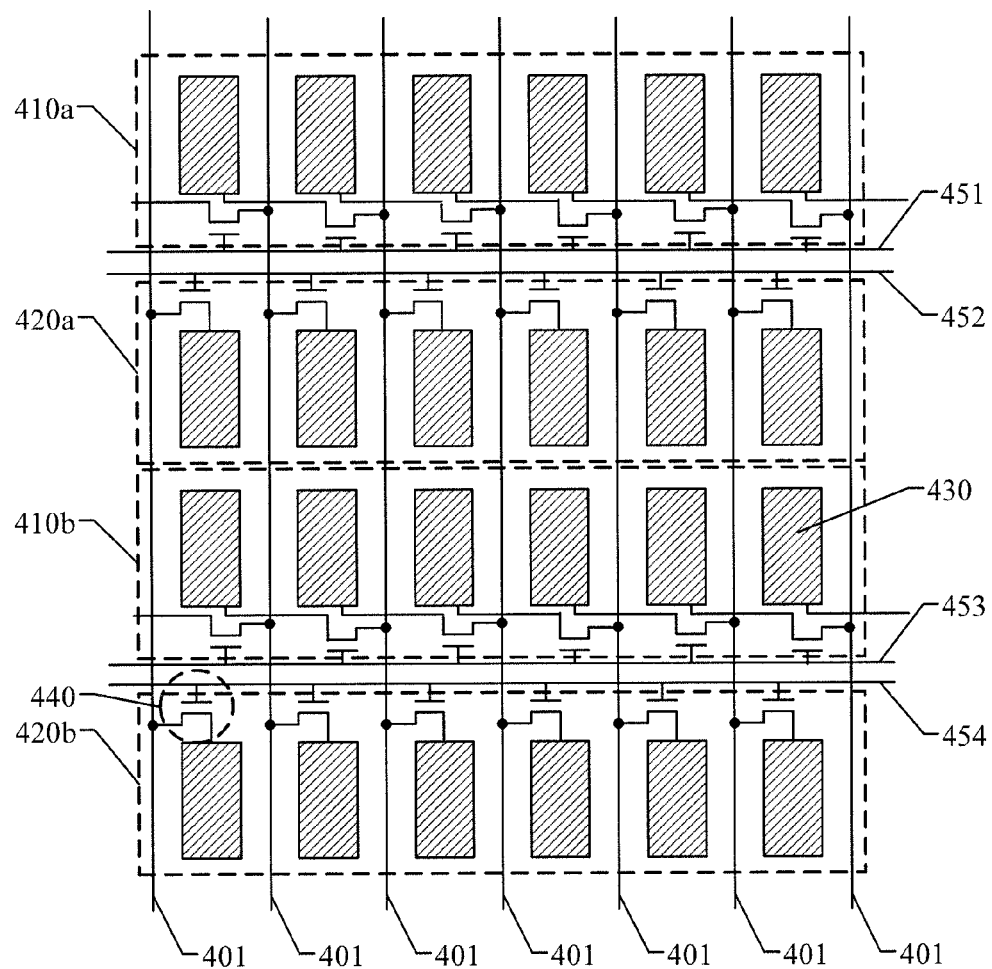
FIG. 7 is a schematic diagram of a pixel structure according to a fourth embodiment of the invention.

FIG. 7 is a schematic diagram of a pixel structure according to a fourth embodiment of the invention, and referring to FIG. 7, the pixel structure according to the fourth embodiment of the invention is similar to the pixel structure according to the first embodiment of the invention except that a gate line of a first row of sub-pixels and a gate line of a second row of sub-pixels are located between the first row of sub-pixels and the second row of sub-pixels.

Particularly in the implementation illustrated in FIG. 7, a gate line 451 to drive a first row of sub-pixels 410a and a gate line 452 to drive a second row of sub-pixels 420a are located between the first row of sub-pixels 410a and the second row of sub-pixels 420a, and also a gate line 453 to drive a first row of sub-pixels 410b and a gate line 454 to drive a second row of sub-pixels 420b are located between the first row of sub-pixels 410b and the second row of sub-pixels 420b. The gate line 452 and the gate line 453 intersect with a data line 401 to define together respective sub-pixels in the second row of sub-pixels 420a and the first row of sub-pixels 410b. FIG. 7 illustrates a pixel electrode 430 in a first row of sub-pixels being provided with a signal over a second-closest data line 401 on right side of the pixel electrode 430, but the pixel electrode 430 in the first row of sub-pixels can alternatively be provided with a signal over a second-closest data line on left side of the pixel electrode 430 in another implementation of the fourth embodiment of the invention. FIG. 7 illustrates a pixel electrode 430 in a second row of sub-pixels being provided with a signal over a first-closest data line 401 on left side of the pixel electrode 430, but the pixel electrode in the second row of sub-pixels can alternatively be provided with a signal over a first-closest data line on right side of the pixel electrode 430 in another implementation of the fourth embodiment of the invention.

Figure 8:
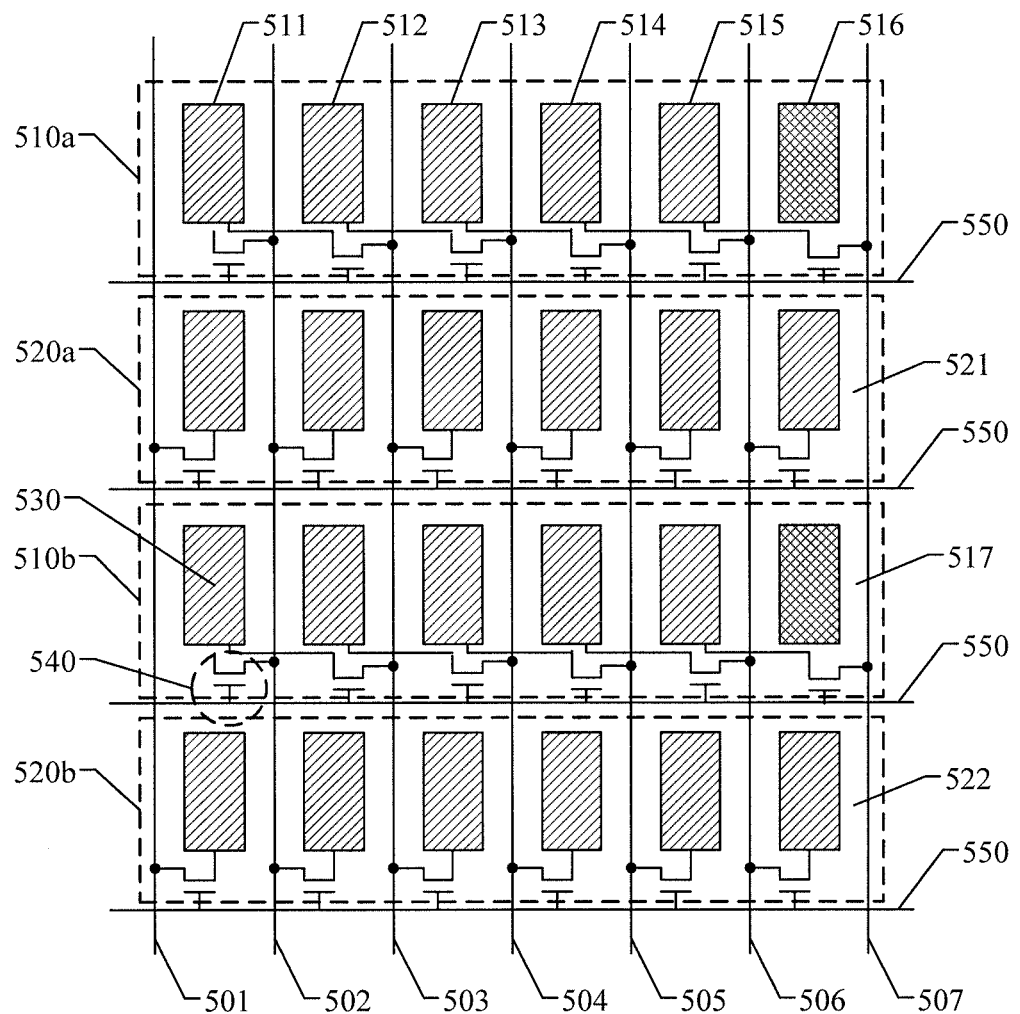
FIG. 8 is a schematic diagram of a pixel structure according to a fifth embodiment of the invention.

FIG. 8 is a schematic diagram of a pixel structure according to a fifth embodiment of the invention, where a pixel structure with sub-pixels being at the edge thereof will be further described in the fifth embodiment based upon the first embodiment. Referring to FIG. 8, a first row of sub-pixels 510 and a second row of sub-pixels 520 are provided with at least one virtual sub-pixel on both ends thereof. In the implementation illustrated in FIG. 8, a first row of sub-pixels 510a includes first sub-pixels 511, 512, 513, 514, 515 and 516, each of which is provided with a signal over a second-closest data line on right side thereof, for example, the first sub-pixel 511 is provided with a signal over the second-closest data line 503 on right side of the first sub-pixel 511, but there is only one data line 507 on right side of the rightmost first sub-pixel 516, so the first sub-pixel 516 will not be provided with a signal over any data line and consequentially cannot display anything, so that the first sub-pixel 516 exists as a virtual sub-pixel. Although second sub-pixels 521 and 522 in the same column as the virtual sub-pixel 516 are provided with signals over the data line 506, they will not display conveniently either because the first sub-pixel in the same column cannot display. Since first sub-pixels in the same column as the first sub-pixel 516 will not be provided with signals over any data lines, all of them will exist as virtual sub-pixels, e.g., a virtual sub-pixel 517.

In another implementation of the first embodiment, such a situation may also arise that a sub-pixel at the edge will not be provided with a signal over any data line, so virtual sub-pixels will be arranged correspondingly on both ends of a first row of sub-pixels or a second row of sub-pixels.

Of course the problem of displaying by a sub-pixel at the edge can be addressed according to the invention without being limited to this implementation but can also be addressed by adding a data line at the edge over which the sub-pixel is provided with a signal.

Figure 9A:
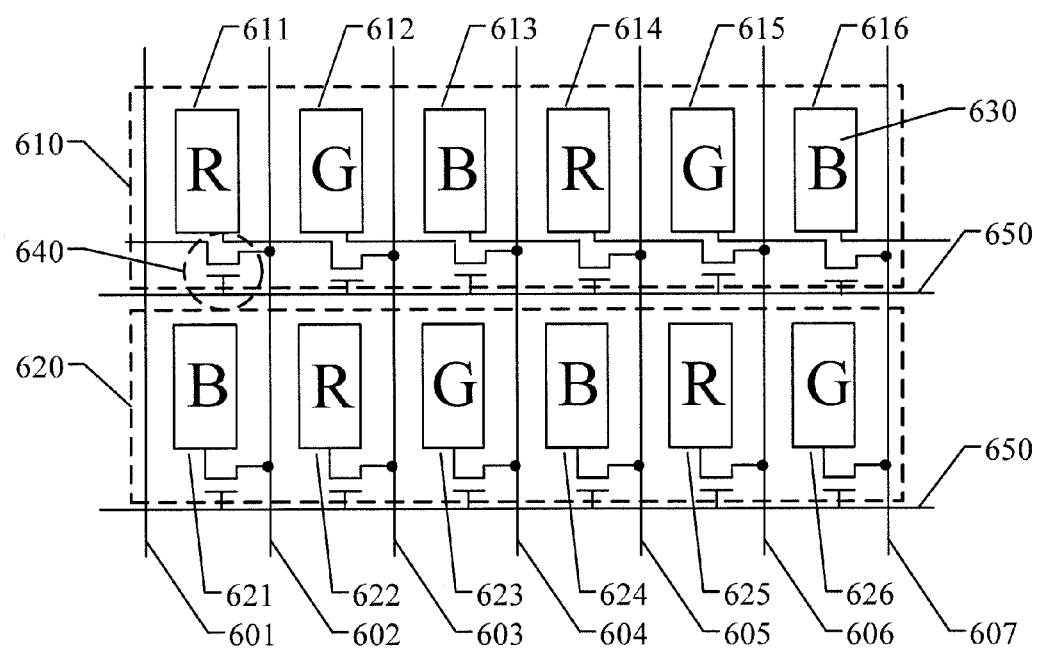
FIG. 9(a) is a schematic diagram of a pixel structure in a first implementation of a sixth embodiment of the invention.
Figure 9B:
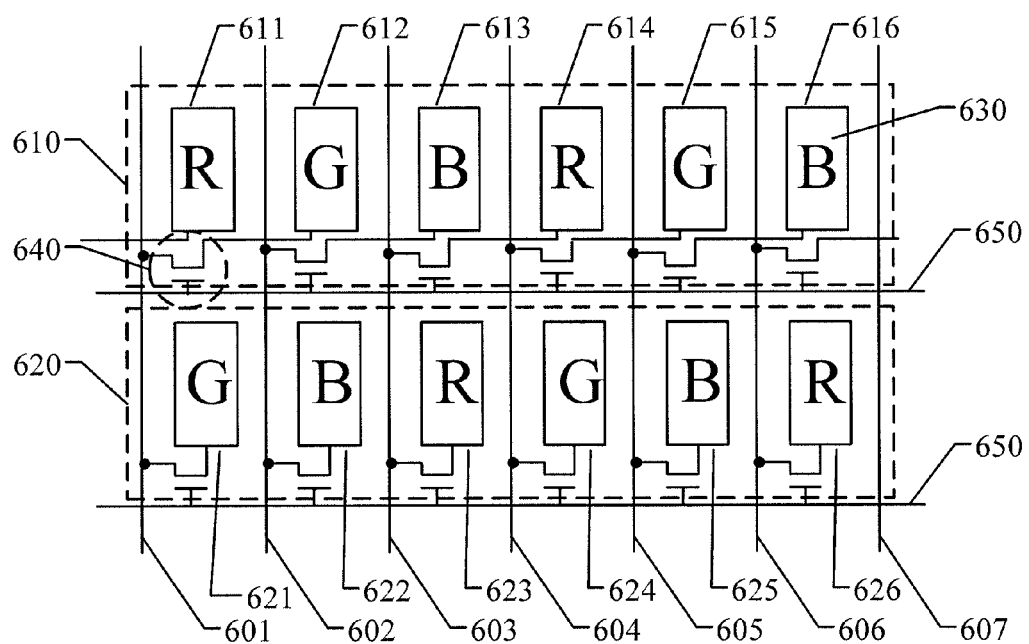
FIG. 9(b) is a schematic diagram of a pixel structure in a second implementation of the sixth embodiment of the invention.
Figure 9C:
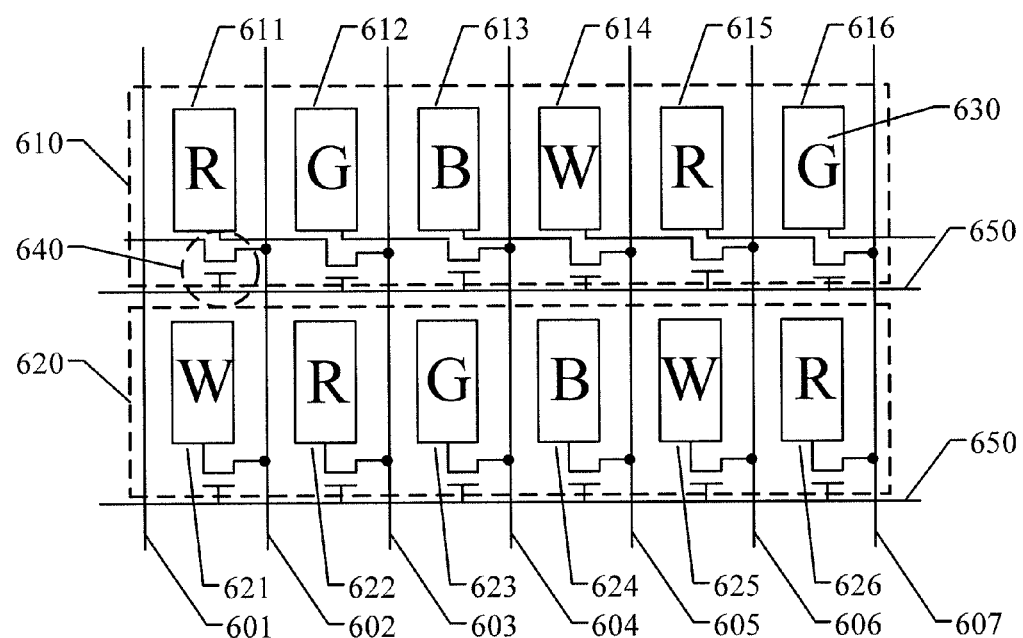
FIG. 9(c) is a schematic diagram of a pixel structure in a third implementation of the sixth embodiment of the invention.

FIG. 9(a) is a schematic diagram of a pixel structure in a first implementation of a sixth embodiment of the invention, and referring to FIG. 9(a), the pixel structure according to the sixth embodiment of the invention is similar to the pixel structure according to the first embodiment of the invention except that the plurality of sub-pixels include sub-pixels in at least three different colors. Particularly the pixel structure in FIG. 9(a) includes sub-pixels in three different colors which are a first color R, a second color G and a third color B respectively.

The sub-pixels in the at least three different colors are arranged in order in a first row of sub-pixels; and the sub-pixels in the at least three different colors are also arranged in order in a second row of sub-pixels. Particularly as illustrated in FIG. 9(a), the sub-pixels in the three different colors are arranged in the order of R, G and B in a first row of sub-pixels 610, and the sub-pixels in the three different colors are arranged in the order of B, R and G in a second row of sub-pixels 620.

A sub-pixel in a first row of sub-pixels, and a sub-pixel in a second row of sub-pixels, connected on the same data line are sub-pixels in the same color, and the two sub-pixels are located respectively on the same side of the data line and in two adjacent two columns of sub-pixels. For example, there are a first sub-pixel 611 and a second sub-pixel 622 connected on a data line 603, where both the first sub-pixel 611 and the second sub-pixel 622 are in the color R, and both the first sub-pixel 611 and the second sub-pixel 622 are located on left side of the data line 603 and in adjacent columns.

Among the sub-pixels in the same color connected on the same data line, the data line of the sub-pixel in the first row of sub-pixels is a second-closest data line on right side of the sub-pixel in the first row of sub-pixels, and the data line of the sub-pixel in the second row of sub-pixels is a first-closest data line on right side of the sub-pixel in the second row of sub-pixels. For example, among the first sub-pixel 611 and the second sub-pixel 622 connected on the data line 603, the data line 603 of the first sub-pixel 611 is the second-closest data line on right side of the first sub-pixel 611, and the data line 603 of the second sub-pixel 622 is the first-closest data line on right side of the second sub-pixel 622.

The effect in the first embodiment can also be achieved in the pixel structure according to the sixth embodiment of the invention, that is, point inversion can be performed by inputting simple signals, and furthermore the pixel structure in the first implementation of the sixth embodiment includes sub-pixels in three colors, and sub-pixels in the same column are in different colors, but sub-pixels connected on the same data line are in the same color, and sub-pixels in the same color in two adjacent columns of sub-pixels can be provided with signals over the same data line. Gates will be enabled row by row in normal visual inspection, and gates will be enabled row by row respectively for odd and even rows in special visual inspection; and if a monochromatic picture is to be displayed, then only data lines in the same color will be enabled so that the same signal is input over these data lines, whereas no signal will be input over data lines in the other colors, so it will be very convenient to display the monochromatic picture and it will also be more convenient for a human inspector to locate a display defect in the monochromatic picture.

FIG. 9(*b*) is a schematic diagram of a pixel structure in a second implementation of a sixth embodiment of the invention, and referring to FIG. 9(*b*), the pixel structure in FIG. 9(*b*) includes sub-pixels in three different colors which are a first color R, a second color G and a third color B respectively.

The sub-pixels in the at least three different colors are arranged in order in a first row of sub-pixels; and the sub-pixels in the at least three different colors are also arranged in order in a second row of sub-pixels. Particularly as illustrated in FIG. 9(*b*), the sub-pixels in the three different colors in a first row of sub-pixels 610 are arranged in the order of R, G and B, and the sub-pixels in the three different colors in a second row of sub-pixels 620 are arranged in the order of G, B and R.

A sub-pixel in a first row of sub-pixels, and a sub-pixel in a second row of sub-pixels, connected on the same data line are sub-pixels in the same color, and the two sub-pixels are located respectively on the same side of the data line and in two adjacent two columns of sub-pixels. For example, there are a first sub-pixel 613 and a second sub-pixel 622 connected on a data line 602, where both the first sub-pixel 613 and the second sub-pixel 622 are in the color B, and both the first sub-pixel 613 and the second sub-pixel 622 are located on right side of the data line 602 and in adjacent columns.

Among the sub-pixels in the same color connected on the same data line, the data line of the sub-pixel in the first row of sub-pixels is a second-closest data line on right side of the sub-pixel in the first row of sub-pixels, and the data line of the sub-pixel in the second row of sub-pixels is a first-closest data line on right side of the sub-pixel in the second row of sub-pixels. For example, among the first sub-pixel 613 and the second sub-pixel 622 connected on the data line 602, the data line 602 of the first sub-pixel 613 is the second-closest data line on left side of the first sub-pixel 613, and the data line 602 of the second sub-pixel 622 is the first-closest data line on left side of the second sub-pixel 622.

The effect in the first embodiment can also be achieved in the pixel structure according to the sixth embodiment of the invention, that is, point inversion can be performed by inputting simple signals, and furthermore the pixel structure in the second implementation of the sixth embodiment includes sub-pixels in three colors, and sub-pixels in the same column are in different colors, but sub-pixels connected on the same data line are in the same color, and sub-pixels in the same color in two adjacent columns of sub-pixels can be provided with signals over the same data line. As in the first implementation, it will be convenient to display a monochromatic picture in normal visual inspection and it will also be more convenient for a human inspector to locate a display defect in the monochromatic picture.

In the two implementations above of the sixth embodiment, the first color, the second color and the third color can be any of red, green and blue, and the first color, the second color and the third color are colors different from each other.

FIG. 9(*c*) is a schematic diagram of a pixel structure in a third implementation of a sixth embodiment of the invention, and referring to FIG. 9(*c*), the pixel structure includes sub-pixels in four different colors which are a first color R, a second color G, a third color B and a fourth color W respectively.

The sub-pixels in the at least four different colors are arranged in order in a first row of sub-pixels; and the sub-pixels in the at least four different colors are also arranged in order in a second row of sub-pixels. For example the sub-pixels in the four different colors in a first row of sub-pixels 610 are arranged in the order of R, G, B and W, and the sub-pixels in the four different colors in a second row of sub-pixels 620 are arranged in the order of W, R, G and B.

A sub-pixel in a first row of sub-pixels, and a sub-pixel in a second row of sub-pixels, connected on the same data line are sub-pixels in the same color, and the two sub-pixels are located respectively on the same side of the data line and in two adjacent two columns of sub-pixels. For example, there are a first sub-pixel 614 and a second sub-pixel 625 connected on a data line 606, where both the first sub-pixel 614 and the second sub-pixel 625 are in the color W, and both the first sub-pixel 614 and the second sub-pixel 625 are located on left side of the data line 606 and in adjacent columns.

Among the sub-pixels in the same color connected on the same data line, the data line of the sub-pixel in the first row of sub-pixels is a second-closest data line on right side of the sub-pixel in the first row of sub-pixels, and the data line of the sub-pixel in the second row of sub-pixels is a first-closest data line on right side of the sub-pixel in the second row of sub-pixels. For example, among the first sub-pixel 614 and the second sub-pixel 625 connected on the data line 606, the data line 606 of the first sub-pixel 614 is the second-closest data line on right side of the first sub-pixel 614, and the data line 606 of the second sub-pixel 625 is the first-closest data line on right side of the first sub-pixel 614.

The effect in the first embodiment can also be achieved in the pixel structure according to the sixth embodiment of the invention, that is, point inversion can be performed by inputting simple signals, and furthermore the pixel structure in the third implementation of the sixth embodiment includes sub-pixels in four colors, and sub-pixels in the same column are in different colors, but sub-pixels connected on the same data line are in the same color, and sub-pixels in the same color in two adjacent columns of sub-pixels can be provided with signals over the same data line. As in the first implementation, it will be convenient to display a monochromatic picture in normal visual inspection and it will also be more convenient for a human inspector to locate a display defect in the monochromatic picture.

Figure 9D:
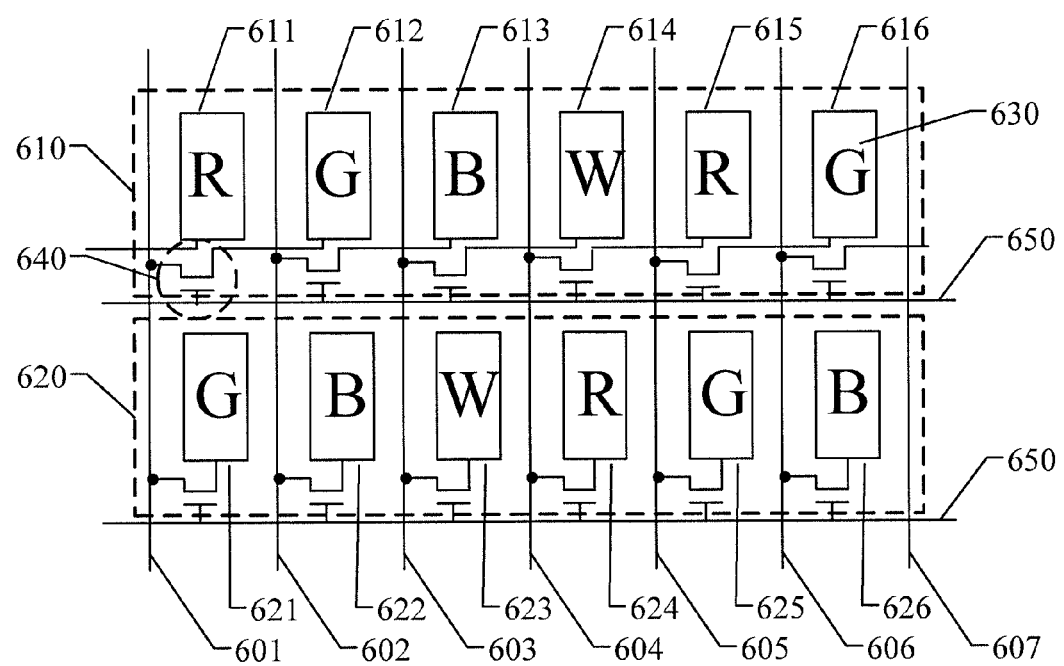
FIG. 9(d) is a schematic diagram of a pixel structure in a fourth implementation of the sixth embodiment of the invention.

FIG. 9(d) is a schematic diagram of a pixel structure in a fourth implementation of a sixth embodiment of the invention, and referring to FIG. 9(d), the pixel structure includes sub-pixels in four different colors which are a first color R, a second color G, a third color B and a fourth color W respectively.

The sub-pixels in the at least four different colors are arranged in order in a first row of sub-pixels; and the sub-pixels in the at least four different colors are also arranged in order in a second row of sub-pixels. For example the sub-pixels in the four different colors in a first row of sub-pixels 610 are arranged in the order of R, G, B and W, and the sub-pixels in the four different colors in a second row of sub-pixels 620 are arranged in the order of G, B, W and R.

Among the sub-pixels in the same color connected on the same data line, the data line of the sub-pixel in the first row of sub-pixels is a second-closest data line on right side of the sub-pixel in the first row of sub-pixels, and the data line of the sub-pixel in the second row of sub-pixels is a first-closest data line on right side of the sub-pixel in the second row of sub-pixels. For example, there are a first sub-pixel 614 and a second sub-pixel 623 connected on a data line 603, where both the first sub-pixel 614 and the second sub-pixel 623 are in the color W, and both the first sub-pixel 614 and the second sub-pixel 623 are located on right side of the data line 603 and in adjacent columns.

Among the sub-pixels in the same color connected on the same data line, the data line of the sub-pixel in the first row of sub-pixels is a second-closest data line on right side of the sub-pixel in the first row of sub-pixels, and the data line of the sub-pixel in the second row of sub-pixels is a first-closest data line on right side of the sub-pixel in the second row of sub-pixels. For example, among the first sub-pixel 614 and the second sub-pixel 623 connected on the data line 603, the data line 603 of the first sub-pixel 614 is the second-closest data line on left side of the first sub-pixel 614, and the data line 603 of the second sub-pixel 623 is the first-closest data line on left side of the second sub-pixel 623.

The effect in the first embodiment can also be achieved in the pixel structure according to the sixth embodiment of the invention, that is, point inversion can be performed by inputting simple signals, and furthermore the pixel structure in the third implementation of the sixth embodiment includes sub-pixels in four colors, and sub-pixels in the same column are in different colors, but sub-pixels connected on the same data line are in the same color, and sub-pixels in the same color in two adjacent columns of sub-pixels can be provided with signals over the same data line. As in the first implementation, it will be convenient to display a monochromatic picture in normal visual inspection and it will also be more convenient for a human inspector to locate a display defect in the monochromatic picture.

In the two implementations immediately above of the sixth embodiment, the first color, the second color, the third color and the fourth color can be any of red, green, blue and white, and the first color, the second color, the third color and the fourth color are colors different from each other.

The effect in the first embodiment can also be achieved in the pixel structure according to the sixth embodiment of the invention, that is, point inversion can be performed by inputting column-inverted signals, and furthermore the pixel structure in the sixth embodiment includes sub-pixels in at least three colors, and sub-pixels in the same column are in different colors, but sub-pixels connected on the same data line are in the same color, and sub-pixels in the same color in two adjacent columns of sub-pixels can be provided with signals over the same data line. Gates will be enabled row by row in normal visual inspection, and gates will be enabled row by row respectively for odd and even rows in special visual inspection; and if a monochromatic picture is to be displayed, then only data lines in the same color will be enabled so that the same signal is input over these data lines, whereas no signal will be input over data lines in the other colors, so it will be very convenient to display the monochromatic picture and it will also be more convenient for a human inspector to locate a display defect in the monochromatic picture.

Figure 10A:
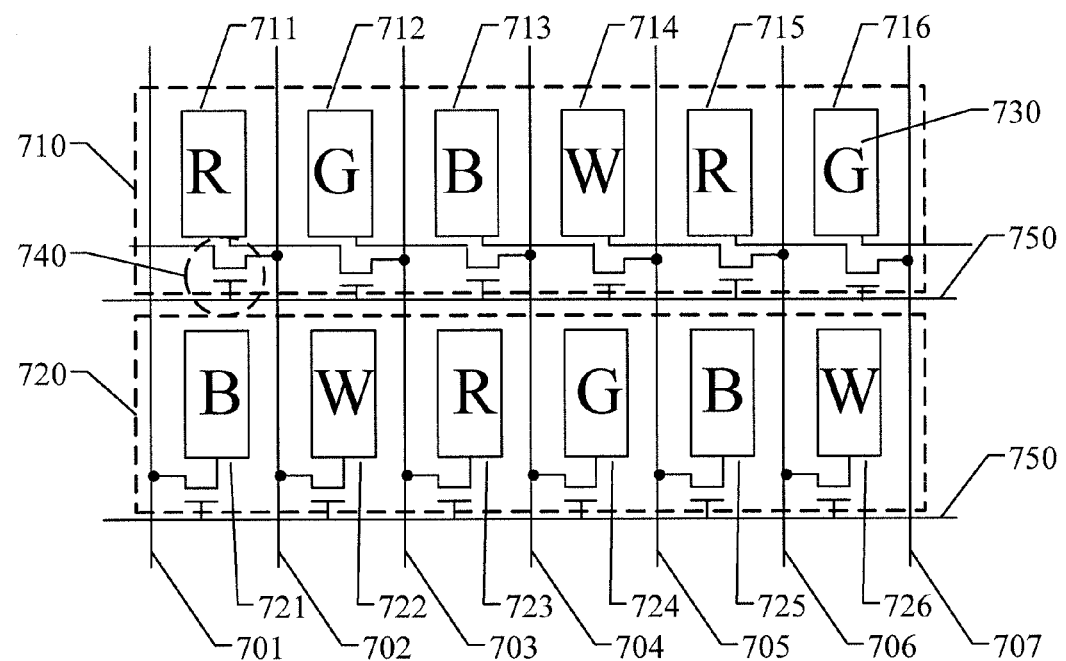
FIG. 10(a) is a schematic diagram of a pixel structure according to a seventh embodiment of the invention.

FIG. 10(a) is a schematic diagram of a pixel structure according to a seventh embodiment of the invention, and referring to FIG. 10(a), the pixel structure according to the seventh embodiment of the invention is similar to the pixel structure according to the first embodiment of the invention except that the plurality of sub-pixels include sub-pixels in at least four different colors. Particularly the pixel structure in FIG. 10(a) includes sub-pixels in four different colors which are a first color R, a second color G, a third color B and a fourth color W respectively. The sub-pixels in the at least four different colors are arranged in order in a first row of sub-pixels; and the sub-pixels in the at least four different colors are also arranged in order in a second row of sub-pixels. For example the sub-pixels in the four different colors in a first row of sub-pixels 710 are arranged in the order of R, G, B and W, and the sub-pixels in the four different colors in a second row of sub-pixels 720 are arranged in the order of B, W, R and G.

A sub-pixel in a first row of sub-pixels, and a sub-pixel in a second row of sub-pixels, connected on the same data line are sub-pixels in the same color, and the two sub-pixels are located respectively on two sides of the data line, and there is a column of sub-pixels between a column of sub-pixels in which the sub-pixel in the first row of sub-pixels is located and a column of sub-pixels in which the sub-pixel in the second row of sub-pixels is located. For example, there are a first sub-pixel 711 and a second sub-pixel 723 connected on a data line 703, where both the first sub-pixel 711 and the second sub-pixel 723 are in the color R, and the first sub-pixel 711 is located on left side of the data line 703 whereas the second sub-pixel 723 is located on right side of the data line 703, and there is a column of sub-pixels, into which a first sub-pixel 712 and a second sub-pixel 722 are arranged, between a column of sub-pixels in which the first sub-pixel 711 is located and a column of sub-pixels in which the second sub-pixel 723 is located.

Among the sub-pixels in the same color connected on the same data line, the data line of the sub-pixel in the first row of sub-pixels is a second-closest data line on right side of the sub-pixel in the first row of sub-pixels, and the data line of the sub-pixel in the second row of sub-pixels is a first-closest data line on left side of the sub-pixel in the second row of sub-pixels. For example, among the first sub-pixel 711 and the second sub-pixel 723 connected on the data line 703, the data line 703 of the first sub-pixel 711 is the second-closest data line on right side of the first sub-pixel 711, and the data line 703 of the second sub-pixel 723 is the first-closest data line on left side of the second sub-pixel 723; or the data line of the sub-pixel in the first row of sub-pixels 710 is the second-closest data line on left side of the sub-pixel in the first row of sub-pixels 710, and the data line of the sub-pixel in the second row of sub-pixels 720 is the first-closest data line on right side of the sub-pixel in the second row of sub-pixels 720.

The effect in the first embodiment can also be achieved in the pixel structure according to the seventh embodiment of the invention, that is, point inversion can be performed by inputting simple signals, and furthermore the pixel structure in the implementation of the seventh embodiment includes sub-pixels in four colors, and sub-pixels in the same column are in different colors, but sub-pixels connected on the same data line are in the same color, and sub-pixels in the same color in two adjacent columns of sub-pixels can be provided with signals over the same data line. Gates will be enabled row by row in normal visual inspection, and gates will be enabled row by row respectively for odd and even rows in special visual inspection; and if a monochromatic picture is to be displayed, then only data lines in the same color will be enabled so that the same signal is input over these data lines, whereas no signal will be input over data lines in the other colors, so it will be very convenient to display the monochromatic picture and it will also be more convenient for a human inspector to locate a display defect in the monochromatic picture.

Figure 10B:
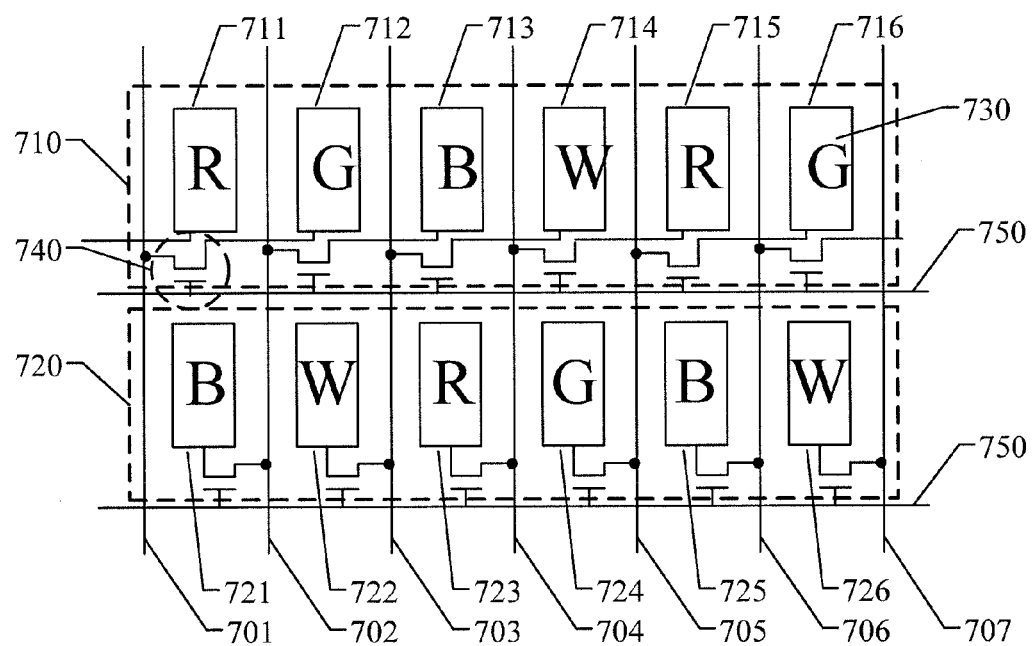
FIG. 10(b) is a schematic diagram of a pixel structure in another implementation of the seventh embodiment of the invention.

FIG. 10(b) is a schematic diagram of a pixel structure in another implementation of the seventh embodiment of the invention, and referring to FIG. 10(b), the pixel structure includes sub-pixels in four different colors which are a first color R, a second color G, a third color B and a fourth color W respectively. The sub-pixels in the at least four different colors are arranged in order in a first row of sub-pixels; and the sub-pixels in the at least four different colors are also arranged in order in a second row of sub-pixels. For example the sub-pixels in the four different colors in a first row of sub-pixels 710 are arranged in the order of R, G, B and W, and the sub-pixels in the four different colors in a second row of sub-pixels 720 are arranged in the order of B, W, R and G.

A sub-pixel in a first row of sub-pixels, and a sub-pixel in a second row of sub-pixels, connected on the same data line are sub-pixels in the same color, and the two sub-pixels are located respectively on two sides of the data line, and there is a column of sub-pixels between a column of sub-pixels in which the sub-pixel in the first row of sub-pixels is located and a column of sub-pixels in which the sub-pixel in the second row of sub-pixels is located. For example, there are a first sub-pixel 714 and a second sub-pixel 722 connected on a data line 703, where both the first sub-pixel 714 and the second sub-pixel 722 are in the color W, and the first sub-pixel 714 is located on right side of the data line 703 whereas the second sub-pixel 722 is located on left side of the data line 703, and there is a column of sub-pixels, into which a first sub-pixel 713 and a second sub-pixel 723 are arranged, between a column of sub-pixels in which the first sub-pixel 714 is located and a column of sub-pixels in which the second sub-pixel 72w is located.

Among the sub-pixels in the same color connected on the same data line, the data line of the sub-pixel in the first row of sub-pixels is a second-closest data line on right side of the sub-pixel in the first row of sub-pixels, and the data line of the sub-pixel in the second row of sub-pixels is a first-closest data line on left side of the sub-pixel in the second row of sub-pixels. For example, among the first sub-pixel 714 and the second sub-pixel 722 connected on the data line 703, the data line 703 of the first sub-pixel 714 is the second-closest data line on left side of the first sub-pixel 714, and the data line 703 of the second sub-pixel 722 is the first-closest data line on right side of the second sub-pixel 722.

The effect in the first embodiment can also be achieved in the pixel structure according to the seventh embodiment of the invention, that is, point inversion can be performed by inputting simple signals, and furthermore the pixel structure in the other implementation of the seventh embodiment includes sub-pixels in four colors, and sub-pixels in the same column are in different colors, but sub-pixels connected on the same data line are in the same color, and sub-pixels in the same color in two adjacent columns of sub-pixels can be provided with signals over the same data line. As in the previous implementation, it will be convenient to display a monochromatic picture in normal visual inspection and it will also be more convenient for a human inspector to locate a display defect in the monochromatic picture.

In the two implementations of the seventh embodiment, the first color, the second color, the third color and the fourth color can be any of red, green, blue and white, and the first color, the second color, the third color and the fourth color are colors different from each other.

The effect in the first embodiment can also be achieved in the pixel structure according to the seventh embodiment of the invention, that is, point inversion can be performed by inputting simple signals, and furthermore the pixel structure in the implementation of the seventh embodiment includes sub-pixels in at least four colors, and sub-pixels in the same column are in different colors, but sub-pixels connected on the same data line are in the same color, and sub-pixels in the same color in two adjacent columns of sub-pixels can be provided with signals over the same data line. Gates will be enabled row by row in normal visual inspection, and gates will be enabled row by row respectively for odd and even rows in special visual inspection; and if a monochromatic picture is to be displayed, then only data lines in the same color will be enabled so that the same signal is input over these data lines, whereas no signal will be input over data lines in the other colors, so it will be very convenient to display the monochromatic picture and it will also be more convenient for a human inspector to locate a display defect in the monochromatic picture.

Figure 11:
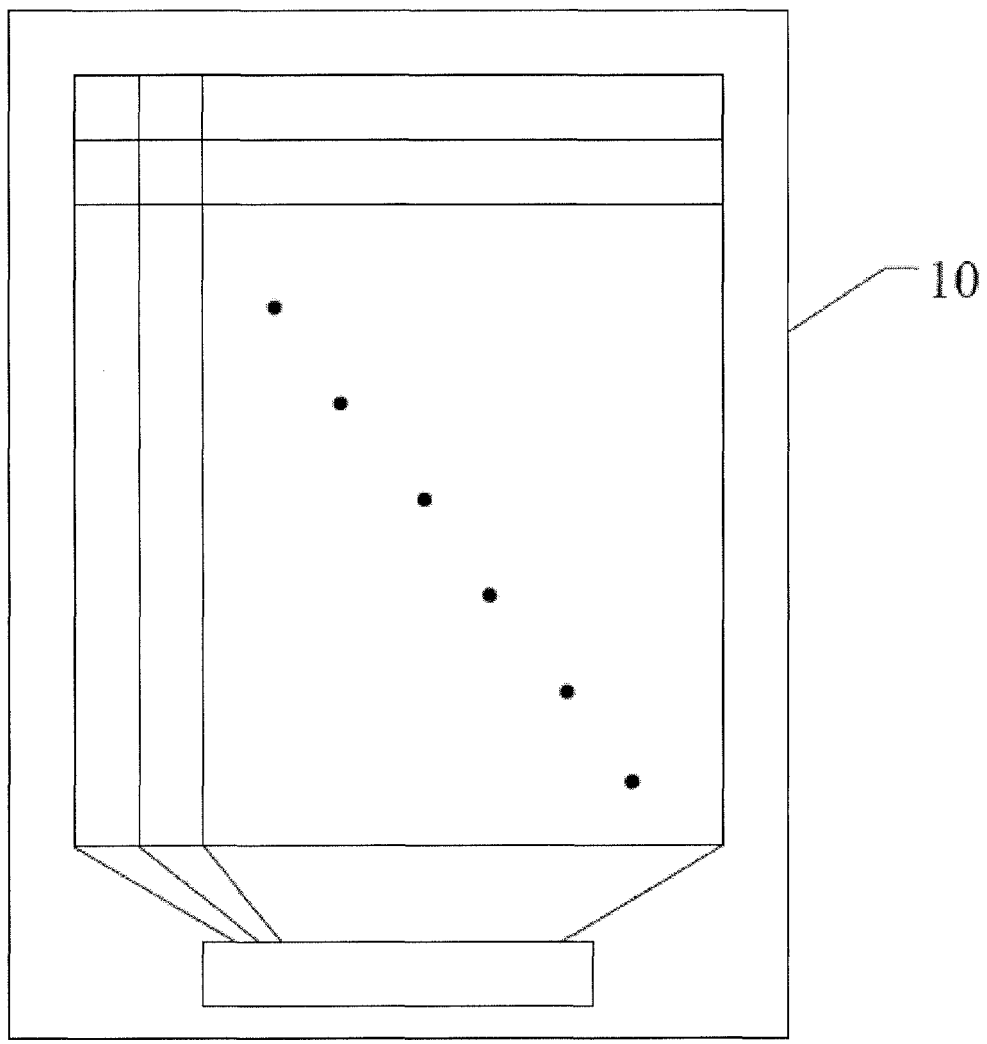
FIG. 11 is a top-view schematic diagram of a liquid crystal display array substrate according to an eighth embodiment of the invention.
Figure 12:
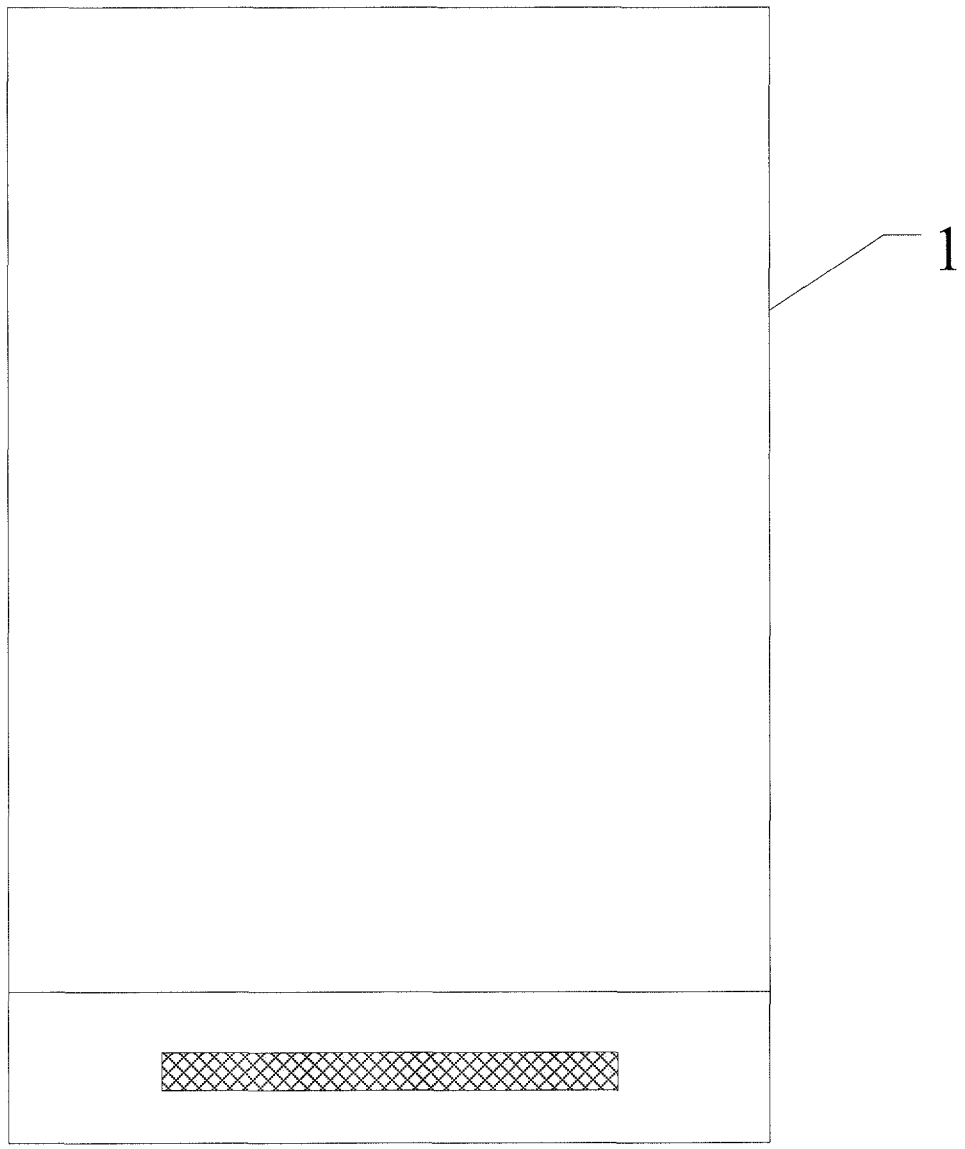
FIG. 12 is a top-view schematic diagram of a liquid crystal display panel according to an embodiment of the invention.

An eighth embodiment of the invention further provides a liquid crystal display array substrate 10 including the pixel structure according to any one of the embodiments above of the invention, as shown in FIG. 11. Also an embodiment of the invention further provides a liquid crystal display panel 1 including the liquid crystal display array substrate according to the eighth embodiment, as shown in FIG. 12.

What is claimed is:
1. A pixel structure, comprising:
   a plurality of data lines arranged in a first direction; and
   a plurality of gate lines arranged in a second direction,
   wherein the plurality of data lines intersect with the plurality of gate lines near a plurality of sub-pixels, each of the plurality of sub-pixels comprising:
   a thin film transistor, and
   a pixel electrode,
   wherein the plurality of sub-pixels comprises:
   a plurality of first rows of sub-pixels, and
   a plurality of second rows of sub-pixels,
   wherein the first rows of sub-pixels and the second rows of sub-pixels are interleaved,
   each sub-pixel in the first rows of sub-pixels is provided with a signal over a second-closest data line,
   each sub-pixel in the second rows of sub-pixels is provided with a signal over a first-closest data line,
   the first-closest data line is each sub-pixel's closest data line, and
   the second-closest data line, which is not adjacent to the each sub-pixel is each sub-pixel's next closest data line.

2. The pixel structure according to claim 1, wherein:
each sub-pixel in the first rows of sub-pixels is provided with a signal over a second-closest data line on a left side of the each sub-pixel in the first rows of sub-pixels; or
each sub-pixel in the first rows of sub-pixels is provided with a signal over a second-closest data line on a right side of the each sub-pixel in the first rows of sub-pixels.

3. The pixel structure according to claim 2, wherein:
in each sub-pixel in the first rows of sub-pixels, the pixel electrode is electrically connected with a drain of the thin film transistor of a sub-pixel on a left side of the each sub-pixel in the first rows of sub-pixels, and a source of the thin film transistor is electrically connected with a first-closest data line on the left side of the each sub-pixel in the first rows of sub-pixels; or
in each sub-pixel in the first rows of sub-pixels, the pixel electrode is electrically connected with the drain of the thin film transistor of a sub-pixel on a right side of the each sub-pixel in the first rows of sub-pixels, and the source of the thin film transistor is electrically connected with a first-closest data line on the right side of the each sub-pixel in the first rows of sub-pixels.

4. The pixel structure according to claim 3, wherein a part of the pixel electrode in each sub-pixel in the first rows of sub-pixels extends across a data line on a left side or on a right side of each sub-pixel in the first rows of sub-pixels to be electrically connected with the drain of the thin film transistor of an adjacent sub-pixel.

5. The pixel structure according to claim 1, wherein:
each sub-pixel in the second rows of sub-pixels is provided with a signal over a first-closest data line on a left side of the each sub-pixel in the second rows of sub-pixels; or
each sub-pixel in the second rows of sub-pixels is provided with a signal over a first-closest data line on right side of the each sub-pixel in the second rows of sub-pixels.

6. The pixel structure according to claim 5, wherein in each sub-pixel in the second rows of sub-pixels, the pixel electrode is electrically connected with a drain of the thin film transistor, and a source of the thin film transistor is electrically connected with a first-closest data line on a left side or on a right side of the sub-pixel in the second rows of sub-pixels.

7. The pixel structure according to claim 1, wherein:
opposite potential difference signals are input over two adjacent data lines; or
two adjacent data lines constitute a group, and opposite potential difference signals are input over two adjacent groups of data lines.

8. The pixel structure according to claim 1, wherein the plurality of gate lines of the first rows of sub-pixels and the plurality of gate lines of the second rows of sub-pixels are located between the first rows of sub-pixels and the second rows of sub-pixels.

9. The pixel structure according to claim 1, wherein the first rows of sub-pixels and the second rows of sub-pixels are provided with at least one virtual sub-pixel at both ends thereof.

10. A liquid crystal display array substrate, comprising the pixel structure according to claim 1.

11. A liquid crystal display panel, comprising the liquid crystal display array substrate according to claim 10.

12. The pixel structure according to claim 1, wherein:
the plurality of sub-pixels include sub-pixels of at least three different colors;
the sub-pixels of the at least three different colors are arranged in order in the first rows of sub-pixels;
the sub-pixels of the at least three different colors are also arranged in order in the second rows of sub-pixels; and
a sub-pixel in a first row of sub-pixels, and a sub-pixel in a second row of sub-pixels, connected on a same data line are sub-pixels of a same color; and the sub-pixel in the first row of sub-pixels, and the sub-pixel in the second row of sub-pixels are located respectively on a same side of the same data line and in two adjacent two columns of sub-pixels.

13. The pixel structure according to claim 12, wherein:
of the sub-pixels in the same color connected on the same data line, the same data line for the sub-pixel in the first row of sub-pixels is a second-closest data line on a left side of the sub-pixel in the first row of sub-pixels, and the same data line of the sub-pixel in the second row of sub-pixels is a first-closest data line on the left side of the sub-pixel in the first row of sub-pixels; or
the same data line of the sub-pixel in the first row of sub-pixels is a second-closest data line on a right side of the sub-pixel in the first row of sub-pixels, and the same data line of the sub-pixel in the second row of sub-pixels is a first-closest data line on the right side of the sub-pixel in the second row of sub-pixels.

14. The pixel structure according to claim 13, wherein the plurality of sub-pixels include sub-pixels of red, green and blue, wherein a first color, a second color, and a third color are any one of red, green and blue, respectively, and are different from each other.

15. The pixel structure according to claim 13, wherein the plurality of sub-pixels include sub-pixels of red, green, blue and white, and a first color, a second color, a third color and a fourth color are any one of red, green, blue and white, respectively, and are different from each other.

16. The pixel structure according to claim 1, wherein:
the plurality of sub-pixels include sub-pixels of at least four different colors;
the sub-pixels of the at least four different colors are arranged in order in the first rows of sub-pixels;
the sub-pixels of the at least four different colors are also arranged in order in the second rows of sub-pixels;
a sub-pixel in a first row of sub-pixels, and a sub-pixel in a second row of sub-pixels, connected on a same data line are sub-pixels in a same color;
the sub-pixel in the first row of sub-pixels and the sub-pixel in the second row of sub-pixels are located respectively on both sides of the same data line, wherein there is one column of sub-pixels between a column of sub-pixels in which the sub-pixel in the first row of sub-pixels is located and a column of sub-pixels in which the sub-pixel in the second row of sub-pixels is located.

17. The pixel structure according to claim 16, wherein:
of the sub-pixels in the same color connected on the same data line, the same data line of the sub-pixel in the first row of sub-pixels is a second-closest data line on a left side of the sub-pixel in the first row of sub-pixels, and the same data line of the sub-pixel in the second row of sub-pixels is a first-closest data line on a right side of the sub-pixel in the second row of sub-pixels ; or
the same data line of the sub-pixel in the first row of sub-pixels is a second-closest data line on the right side of the sub-pixel in the first row of sub-pixels, and the same data line of the sub-pixel in the second row of sub-pixels is a first-closest data line on left the side of the sub-pixel in the second row of sub-pixels.

18. The pixel structure according to claim 17, wherein the plurality of sub-pixels include sub-pixels of red, green, blue and white, and a first color, a second color, a third color and a fourth color are any one of red, green, blue and white, respectively, and are different from each other.

* * * * *